(12) United States Patent
Li et al.

(10) Patent No.: US 9,698,134 B2
(45) Date of Patent: Jul. 4, 2017

(54) METHOD FOR MANUFACTURING A LIGHT EMITTED DIODE DISPLAY

(71) Applicant: SCT TECHNOLOGY, LTD., Grand Cayman (KY)

(72) Inventors: Eric Li, Milpitas, CA (US); Heng Liu, Sunnyvale, CA (US); Sheanyih Chiou, San Jose, CA (US)

(73) Assignee: SCT TECHNOLOGY, LTD., Grand Cayman (KY)

( * ) Notice: Subject to any disclaimer, the term of this patent is extended or adjusted under 35 U.S.C. 154(b) by 0 days.

(21) Appl. No.: 14/953,246

(22) Filed: Nov. 27, 2015

(65) Prior Publication Data

US 2016/0155892 A1    Jun. 2, 2016

Related U.S. Application Data

(60) Provisional application No. 62/085,299, filed on Nov. 27, 2014, provisional application No. 62/092,114, (Continued)

(51) Int. Cl.
*H01L 21/70* (2006.01)
*H01L 25/00* (2006.01)
(Continued)

(52) U.S. Cl.
CPC ........ *H01L 25/50* (2013.01); *H01L 21/67144* (2013.01); *H01L 21/6831* (2013.01);
(Continued)

(58) Field of Classification Search
CPC ....... H01L 2924/00; H01L 2924/00014; H01L 2924/0002; H01L 2224/13111; H01L 2224/131; H01L 2224/48091; H01L 2924/12042; H01L 2224/81815; H01L 2924/014; H01L 2224/81203; H01L 25/0753; H01L 2924/10
See application file for complete search history.

(56) References Cited

U.S. PATENT DOCUMENTS

2006/0284190 A1*  12/2006  Zimmerman ........... H01L 33/20
                                                                  257/79
2010/0176705 A1*  7/2010  Van Herpen ...... B32B 17/10036
                                                                  313/46

(Continued)

*Primary Examiner* — Robert Bachner
(74) *Attorney, Agent, or Firm* — Novick, Kim & Lee, PLLC; Allen Xue

(57) ABSTRACT

A method for manufacturing a micro LED display is provided. The method includes providing a plurality of LED elements on a first substrate, transferring, using a magnetic holder or a vacuum holder, at least two of the plurality of LED elements of the same primary color from the first substrate to a second substrate, performing the steps of the providing and the transferring with respect to three primary colors, forming an array of RGB LED units on the second substrate, each of the array of RGB LED units including a red LED element, a green LED element, and a blue LED element, interposing the array of RGB LED units between the second substrate and an LED driver wafer, detaching the second substrate from the array of RGB LED units, and interposing the array of RGB LED units between the LED driver wafer and a cover.

5 Claims, 23 Drawing Sheets

Related U.S. Application Data filed on Dec. 15, 2014, provisional application No. 62/110,672, filed on Feb. 2, 2015.

(51) Int. Cl.

| | | |
|---|---|---|
| *H01L 23/00* | (2006.01) | |
| *H01L 25/075* | (2006.01) | |
| *H01L 21/67* | (2006.01) | |
| *H01L 21/683* | (2006.01) | |
| *H01L 21/66* | (2006.01) | |
| *H01L 25/16* | (2006.01) | |
| *H01L 25/18* | (2006.01) | |
| *H01L 33/00* | (2010.01) | |
| *H01L 33/62* | (2010.01) | |
| *H01L 27/15* | (2006.01) | |

(52) U.S. Cl.
CPC .......... *H01L 21/6838* (2013.01); *H01L 22/20* (2013.01); *H01L 24/00* (2013.01); *H01L 25/0753* (2013.01); *H01L 25/167* (2013.01); *H01L 25/18* (2013.01); *H01L 33/0079* (2013.01); *H01L 27/156* (2013.01); *H01L 33/0095* (2013.01); *H01L 33/62* (2013.01)

(56) References Cited

U.S. PATENT DOCUMENTS

| | | | | |
|---|---|---|---|---|
| 2012/0320581 A1* | 12/2012 | Rogers | ............. | H01L 24/24 |
| | | | | 362/235 |
| 2013/0300984 A1* | 11/2013 | Lin | ............. | H01L 25/0753 |
| | | | | 349/69 |
| 2014/0225136 A1* | 8/2014 | Kim | ............. | H01L 33/62 |
| | | | | 257/89 |

* cited by examiner

METHOD FOR MANUFACTURING A LIGHT EMITTED DIODE DISPLAY

UTILITY PATENT APPLICATION

This application is a non-provisional application and claims benefit from U.S. provisional application Ser. No. 62/085,299, filed Nov. 27, 2014, U.S. provisional application Ser. No. 62/092,114, filed Dec. 15, 2014, and U.S. provisional application Ser. No. 62/110,672, filed Feb. 2, 2015, the disclosures of which are hereby incorporated by reference.

FIELD OF THE DISCLOSURE

This disclosure relates generally to a light emitting diode (LED) display and a method for manufacturing the same, in particular to a micro LED display.

BACKGROUND OF THE DISCLOSURE

Light emitting diodes (LEDs) are well-known semiconductor devices that convert current into light. The color of the light (wavelength) emitted by an LED depends on the semiconductor materials used. Gallium-Nitride (GaN) has gained much attention, because it is found that GaN can be combined with indium to produce InGaN/GaN semiconductor layers that can emit green, blue, and ultraviolet light. This wavelength controllability enables an LED semiconductor designer to tailor material characteristics to achieve beneficial device characteristics. Accordingly, GaN-based optoelectronic device technology has rapidly evolved since their commercial introduction in 1994.

Light emitting diodes (LEDs) based upon gallium nitride (GaN) are expected to be used in future high-efficiency lighting applications, replacing incandescent and fluorescent lighting lamps. Current GaN-based LED devices are prepared by heteroepitaxial growth techniques on foreign substrate materials. A typical wafer level LED device structure may include a lower n-doped GaN layer formed over a sapphire growth substrate, a single quantum well (SQW) or multiple quantum well (MWQ), and an upper p-doped GaN layer.

Micro-LED, also known as microLED, mLED or µLED, is an emerging flat panel display technology. Micro-LED displays have arrays of microscopic LEDs forming the individual pixel elements. Compared to the widespread LCD technology, micro-LED displays offer far greater contrast, much faster response times, and would use less energy Conventionally, during the in micro-LED manufacture, RGB pixel is provided and manufactured one by one. Since this process takes longer time, for mass production, more efficient and faster manufacturing method is required.

SUMMARY OF THE DISCLOSURE

In view of the aforementioned needs, the present disclosure provides a method for manufacturing an LED display. According to one embodiment of the present disclosure, a method for manufacturing a light emitting diode (LED) display is provided. The method includes providing a plurality of LED elements on a first substrate, each of the plurality of LED elements being of a same primary color of three primary colors, transferring, using a magnetic holder or a vacuum holder, at least two of the plurality of LED elements of the same primary color from the first substrate to a second substrate, performing the steps of the providing and the transferring with respect to LED elements for each of two remaining primary colors, forming an array of RGB LED units on the second substrate, each of the array of RGB LED units including a red LED element, a green LED element, and a blue LED element, interposing the array of RGB LED units between the second substrate and an LED driver wafer, detaching the second substrate from the array of RGB LED units, and interposing the array of RGB LED units between the LED driver wafer and a cover.

A size of each of the array of RGB LED units is equal to or smaller than 100 µm.

The forming step further employs a lithographic etching process to divide the red LED element, the green LED element, and the blue LED element of the array of RGB LED units into a red LED pixel, a green LED pixel, and a blue LED pixel.

Each of the array of RGB LED units includes the red LED pixel, the green LED pixel, and the blue LED pixel in a row. The magnetic holder includes a first magnetic holder, a second magnetic holder, and a third magnetic holder. The transferring step includes lifting, by the first magnetic holder, the at least two of the plurality of LED elements from the first substrate, releasing the at least two of the plurality of LED elements from the first magnetic holder to the second magnetic holder, attaching the at least two of the plurality of LED elements to the second magnetic holder, and lifting, by the third magnetic holder the at least two of the plurality of LED elements from the second magnetic holder. The performing step includes performing the above steps until the third magnetic holder holds the array of RGB LED units and placing the array of RGB LED units onto the second substrate. The second substrates is a fourth magnetic holder. The detaching the second substrate includes turning off magnetic field of the fourth magnetic holder. The holder includes both of the magnetic holder and the vacuum holder.

The transferring step includes lifting, by the magnetic holder, the at least two of the plurality of LED elements from the first substrate, suctioning, by the vacuum holder, the at least two of the plurality of LED elements, and performing the above steps until the vacuum holder holds the array of RGB LED units.

The method further includes detaching the magnetic holder from the array of RGB LED units on the vacuum holder, testing the array of RGB LED units on the vacuum holder with an LED probe card, attaching the magnetic holder to the array of RGB LED units, detaching the vacuum holder by turning off vacuum suction, and replacing an out-of-specification (OOS) LED element with a single vacuum head.

Each of the array of RGB LED units includes a first electrode and a second electrode disposed on a same surface of the array of RGB LED units.

According to another embodiment, each of the array of RGB LED units includes a first electrode and a second electrode, and the first electrode and the second electrode are respectively disposed on two opposite surfaces of the array of RGB LED units.

At least one of the first substrate, the second substrate, and the LED driver wafer includes an adhesive layer for holding the LED elements or the array of RGB LED units.

The adhesive layer is heated to release the LED elements or the array of RGB LED units.

The interposing step includes forming an anisotropic conductive film (ACF) layer between the LED driver wafer and the second substrate. The cover is either a glass panel or a touch sensitive panel.

The first substrate is either a sapphire substrate or a transparent substrate, and wherein the transferring step further comprises a lazier lift off (LLO) method to separate the at least two of the plurality of LED elements from the first substrate.

The first substrate is a GaAs substrate and wherein the transferring step further includes etching the first substrate using ammonia hydroxide to separate the at least two of the plurality of LED elements from the first substrate.

According to another embodiment of the present disclosure, a method for manufacturing a micro-light emitting diode (LED) display is provided. The method includes providing a first substrate having a plurality of red LED elements, providing a second substrate having a plurality of green LED elements, providing a third substrate having a plurality of blue LED elements, transferring, using a magnetic holder or a vacuum holder, at least two of the plurality of red LED elements from the first substrate to a fourth substrate, transferring, using the magnetic holder or the vacuum holder, at least two of the plurality of green LED elements from the second substrate to a fourth substrate, transferring, using the magnetic holder or the vacuum holder, at least two of the plurality of blue LED elements from the third substrate to a fourth substrate, forming a plurality of patterns, each of the plurality of patterns having a red LED element, a green LED element, and a blue LED element in a row, dividing the red LED element, the blue LED element, and the green LED element into a red LED pixel, a green LED pixel, and a blue LED pixel, respectively so as to form an array of RGB LED units on the fourth substrate, interposing the array of RGB LED units between the fourth substrate and an LED driver wafer, detaching the fourth substrate from the array of RGB LED units, and interposing the array of RGB LED units between the LED driver wafer and a cover.

A size of each of the array of RGB LED units is equal to or smaller than 100 μm. The interposing step comprising forming an anisotropic conductive film (ACF) layer between the LED driver wafer and the fourth substrate. The magnetic holder comprises a first magnetic holder, a second magnetic holder, and a third magnetic holder. The transferring step includes lifting, by the first magnetic holder, the at least two of the plurality of LED elements from the first substrate, releasing the at least two of the plurality of LED elements from the first magnetic holder to the second magnetic holder, attaching the at least two of the plurality of LED elements to the second magnetic holder, and lifting, by the third magnetic holder the at least two of the plurality of LED elements from the second magnetic holder. The performing step comprises performing the above steps until the third magnetic holder holds the array of RGB LED units and placing the array of RGB LED units onto the fourth substrate, wherein the fourth substrates is a fourth magnetic holder. The detaching the fourth substrate comprises turning off magnetic field of the fourth magnetic holder.

The transferring step includes lifting, by the magnetic holder, the at least two of the plurality of LED elements from the first substrate, suctioning, by the vacuum holder, the at least two of the plurality of LED elements, and performing the above steps until the vacuum holder holds the array of RGB LED units.

The method further includes detaching the magnetic holder from the array of RGB LED units on the vacuum holder, testing the array of RGB LED units on the vacuum holder with an LED probe card, attaching the magnetic holder to the array of RGB LED units, detaching the vacuum holder by turning off vacuum suction, and replacing an out-of-spec (OOS) LED element with a single vacuum head.

According to the other embodiment of the present disclosure, a micro-light emitting diode (LED) display is provided. The micro-LED display includes a first substrate, a red LED pixel, a green LED pixel, and a blue LED pixel disposed on the first substrate and having a pitch smaller than a predetermined size, a second substrate having a first electrode, a second electrode, and a third electrode electrically coupled to the red LED pixel, the green LED pixel, and the blue LED pixel, respectively, and an anisotropic conductive films (ACF) layer interposed between the first substrate and the second substrate, wherein the ACF layer comprises a conductive particle.

Each of the array of RGB LED units includes the red LED pixel, the green LED pixel, and the blue LED pixel in a row.

The pitch is smaller than 100 μm. The conductive particle is nano-sized metal particle.

The first substrate is cover glass or touch sensitive panel.

BRIEF DESCRIPTION OF THE DRAWINGS

FIG. 14b is another section view taken from a view normal to the one for FIG. 14a.

DETAILED DESCRIPTION OF THE PREFERRED EMBODIMENT

Figure 1:
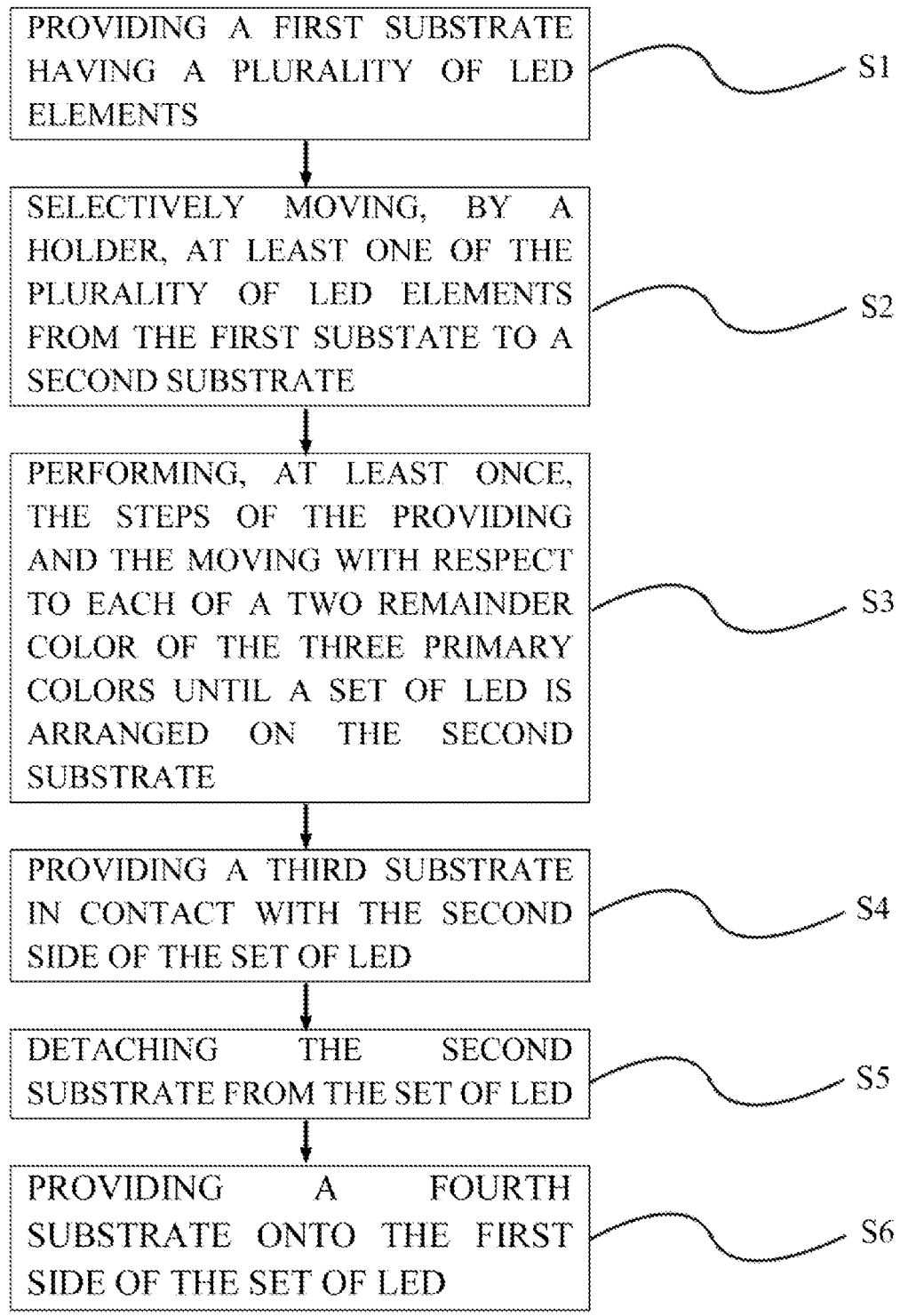
FIG. 1 is a brief flow chart for manufacturing a light emitting diode (LED) display according to the present disclosure.

Reference will now be made in detail to embodiments, examples of which are illustrated in the accompanying drawings, wherein like reference numerals refer to the like elements throughout the several views. In this regard, the present embodiments may have different forms and should not be construed as being limited to the descriptions set forth herein. Accordingly, the embodiments are merely described below, by referring to the figures, to explain aspects of the present description. Terms used herein are for descriptive purposes only and are not intended to limit the scope of the disclosure. The terms "comprises" and/or "comprising" are used to specify the presence of stated elements, steps, operations, and/or components, but do not preclude the presence or addition of one or more other elements, steps, operations, and/or components. The terms "first," "second," and the like may be used to describe various elements, but do not limit the elements. Such terms are only used to distinguish one element from another.

In the following description, all numbers disclosed herein are approximate values, regardless whether the word "about" or "approximate" is used in connection therewith. The value of each number may differ by 1%, 2%, 5%, 7%, 8%, 10%, 15% or 20%. Therefore, whenever a number having a value N is disclosed, any number having the value N+/−1%, N+/−2%, N+/−3%, N+/−5%, N+/−7%, N+/−8%, N+/−10%, N+/−15% or N+/−20% is specifically disclosed, wherein "+/−" refers to plus or minus. Whenever a numerical range with a lower limit, RL, and an upper limit, RU, is disclosed, any number falling within the range is specifically disclosed. In particular, the following numbers within the range are specifically disclosed: $R=R_L+k*(R_U-R_L)$, wherein k is a variable ranging from 1% to 100% with a 1% increment, i.e., k is 1%, 2%, 3%, 4%, 5%, ..., 50%, 51%, 52%, ..., 95%, 96%, 97%, 98%, 99%, or 100%. Moreover, any numerical range defined by two R numbers as defined above is also specifically disclosed.

These and/or other aspects become apparent and are more readily appreciated by those of ordinary skill in the art from the following description of embodiments of the present disclosure, taken in conjunction with the accompanying drawings. The figures depict embodiments of the present disclosure for purposes of illustration only. One skilled in the art will readily recognize from the following description that alternative embodiments of the structures and methods illustrated herein may be employed without departing from the principles of the disclosure described herein.

The current disclosure provides a method for making high resolution (HD) and ultra-high resolution (UHD) micro-LED displays, e.g., those for smart phone uses. Micro-LED display is a direct emissive type display. According to micro-LED technology, LED is not merely used for backlight purpose but RGB lights are emitted directly from the micro-LED pixel, without any color filter. Micro LED display usually has a less than 100 μm-size pixel.

FIG. 1 is a flow chart for manufacturing a micro-light emitting diode (LED) display according to the present disclosure. The method includes the following six (6) steps: providing a a plurality of LED elements 10, 20, and 30 on a first substrate 100 (S1), selectively transferring, by a holder 200, at least two of the plurality of LED elements 10, 20, and 30 from the first substrate 100 to a second substrate 300 (S2), performing, at least once, the steps of the providing (S1) and the transferring (S2) with respect to each of two remaining primary colors until an array of LED units 40 is arranged on second substrate 300 (S3), providing a third substrate 400 in contact with a second surface 10b of the array of LED units 40 (S4), detaching second substrate 300 form the array of LED units 40 (S5), and providing a fourth substrate 500 onto a first surface 10a of the array of LED units 40 (S6). The third substrate can be an LED driver wafer while the fourth substrate serves as a cover of the micro-LED display.

Each step of the first embodiment of the present disclosure would be further described below in conjunction with FIGS. 2-13.

Figure 2:
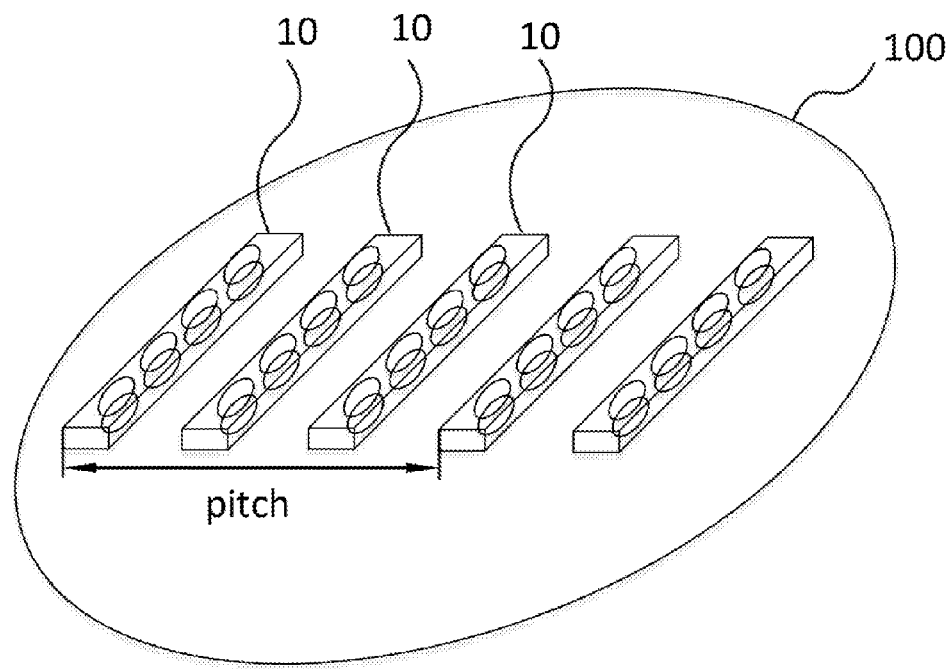
FIG. 2 is a perspective view illustrating a plurality of first LED strips on first substrate.
Figure 3:
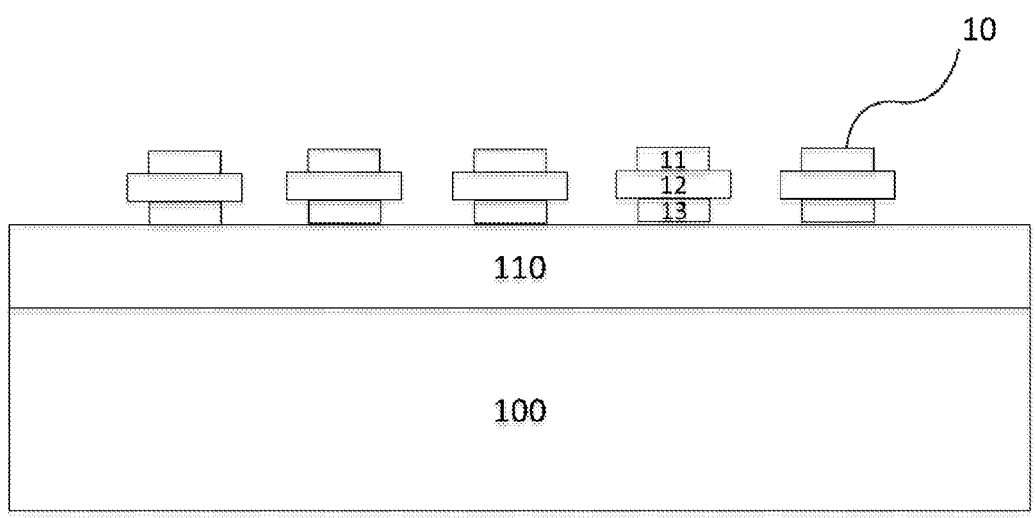
FIG. 3 is a section view illustrating a plurality of first LED strips s disposed on an adhesive layer and first substrate.

FIG. 2 is a perspective view illustrating a plurality of first LED elements 10 on first substrate 100. FIG. 3 is a section view illustrating a plurality of first LED elements 10 disposed on an adhesive layer 110 and first substrate 100. In the providing step (S1), a first substrate 100 having a plurality of LED elements 10 is provided. The plurality of first LED elements 10 forms first LED strip 10. Hereinafter, the plurality of first LED elements are also generally referred to as first LED element, first LED strip 10, first LED strips 10, or collectively LED strips 10. Each of first LED strips 10 has a first color. In a similar manner, a plurality of second LED elements 20 can form a second LED strip 20 with a second color, and a plurality of third LED elements 30 can form a third LED strip 30 with a third color. Each of the first color, the second color, and the third color is one of primary colors, including but not limited to red, green, or blue, respectively. For the purpose of example, only first LED strip 10 is described below in detail but second LED strip 20 and third LED strip 30 can be provided in a similar manner.

A pixel pitch is defined by a width of three (3) first LED strips 10. For instance, if the pitch is 70 μm, then the width of the first LED strip is 70/3 minus space between the first LED strip 10. Furthermore, although the term "LED strip" as well as its illustrations suggest a long strip of LED material, the length of the LED strip in the longitudinal direction can be large or small. For example, the LED strip may be in a substantially square shape. In this sense, "LED strip," "LED chip," "LED element," and "LED pixel" are used interchangeably.

Each of the plurality of first LED elements 10 has a first surface 10a and a second surface 10b. The second surface 10b is disposed to face an opposite direction of first surface 10a. Since each of the plurality of first LED elements 10 would be arranged to face a same direction, hereinafter, the plurality of first LED elements 10 would be generally referred to as having the first surface 10a and the second surface 10b.

Each of the plurality of first LED elements also includes N-electrode 11, active material 12, and P-electrode 13. Each of N-electrode 11 and P-electrode 13 is made of metal materials, i.e. Ni or F and may include magnetic materials that can be attracted by a magnet or interact with a magnetic field. Since each of N-electrode 11 and P-electrode 13 is responsive to a magnet field, a magnetic field may lift first LED strip 10 from first substrate 100. The active material 12 includes n-GaN layer (not shown), active layer (not shown), and p-GaN layer (not shown), and one of ordinary skill in the art would appreciate how to make the active material 12. The plurality of LED elements 10 (LED strip) are affixed on first substrate 100 using a first adhesive layer 110. First substrate 100 is in contact with first surface 10a of the plurality of LED elements 10. First adhesive layer 110 can include, i.e. a wax layer. Any suitable wax may be used as long as the plurality of LED elements 10 may be satisfactorily affixed to first substrate 100. Examples of the wax layer may include a paraffin-based wax.

Referring to FIG. 3, N-electrode 11 and P-electrode 13 are disposed on the opposite surface of the plurality of LED elements 10. Hereinafter, N-electrode 11 and P-electrode 13 are also generally referred to as electrodes or metal contacts. Although FIG. 2 illustrates that P-electrode 13 is in contact with first adhesive layer 110, the configuration of N-electrode 11 and P-electrode 13 are not limited thereto. For instance, N-electrode 11 can be in contact with first adhesive layer 110 and P-electrode 13 can be disposed opposite surface of N-electrode 11. In another embodiment of the present disclosure, N-electrode 11 and P-electrode 13 can be disposed on the same surface as well.

If N and P electrodes 11 and 13 reside on the same surface of LED strip 10, it is referred to as lateral LED strip. If N and P electrodes 11 and 13 reside on the opposite surfaces of LED strip 10, it is referred to as vertical LED strip.

Figure 4:
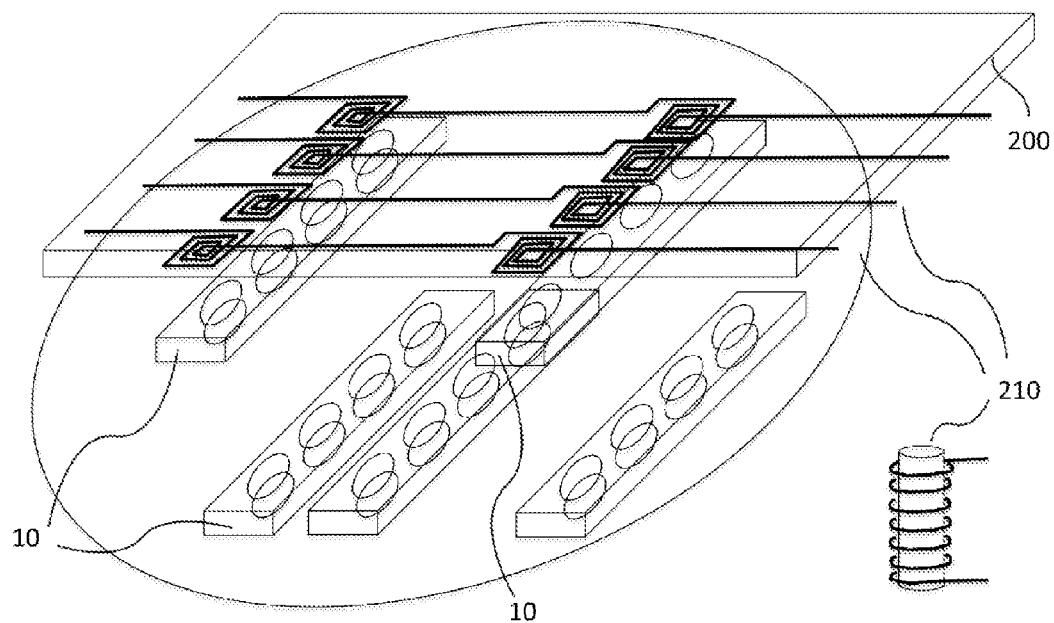
FIG. 4 is a schematic diagram illustrating a holder transferring at least two of the first LED strips from first substrate to second substrate.

FIG. 4 is a schematic diagram illustrating a holder 200 transferring at least two of the first LED strips 10 from first substrate 100 to second substrate 300. In the transferring step (S2), holder 200 selectively moves at least two of the plurality of first LED elements 10 from first substrate 100 to second substrate 300.

Holder 200 can be any suitable means that can pick up LED elements from a substrate and hold them during transfer (S2) in accordance with embodiments of the present disclosure. For example, holder 200 may lift the micro LED structure using vacuum (i.e., suction), magnetic, adhesive, or electrostatic forces to pick up the first LED strip 10. As an example, holder 200 may be, but is not limited thereto, a magnetic pick up device. Holder 200 may be comprised of permanent magnet or electromagnet. Holder 200 can selectively pick up and move at least two of first LED strip 10 using by magnetic force generated by an array of magnetic inductors 210. Holder 200 can, for instance, pick up every other three first LED strips 10 from first substrate 100. A plurality of first LED strips 10 disposed on first substrate 100 can have same color and need to be selectively moved to second substrate 200 so as to arrange all of three primary colors, i.e. red, green, and blue on second substrate 300. An inductor can be used to generate the magnetic field. During the moving process, holder 200 is in contact with second surface 10b of the at least two of first LED strips 10.

Figure 5:
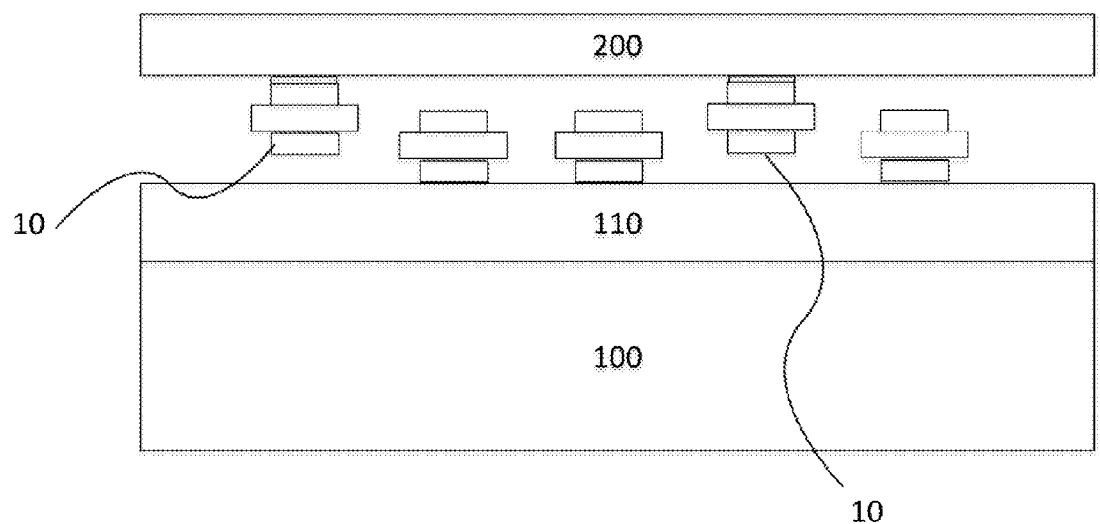
FIG. 5 is a section view of FIG. 4.

FIG. 5 is a section view of FIG. 4. First substrate 100 may be heated to soften or melt first adhesive layer 110 so that first LED strip 10 can be easily detached from first substrate 100. The current to the magnetic inductors (not shown) is turned on to generate a magnetic field from holder 200. As explained with respect to FIG. 4, one in every three first LED strips 10 is lifted up from first substrate 100. The current to the inductors (not shown) can be adjusted so that holder 200 may be used to selectively pick only one in three first LED strips 10. A control unit (not shown) can be provided to program the selection of first LED strips 10 and control the magnetic inductors. The control unit (not shown) can be a software computer application or a hardware associated with the software computer application.

Figure 6:
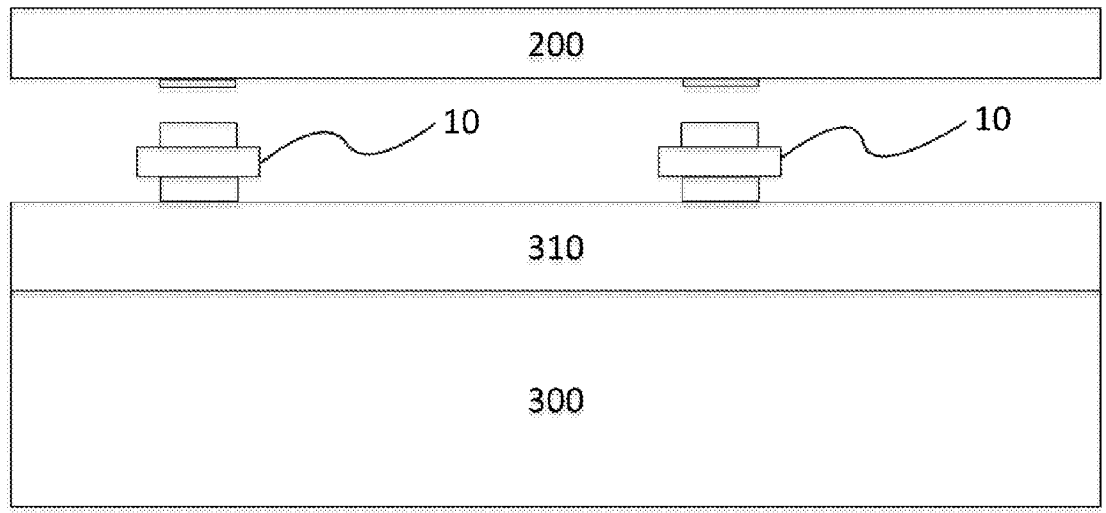
FIG. 6 is a section view illustrating the transferring operation of first LED strips onto a second substrate using a holder.

FIG. 6 is a section view illustrating the transferring operation of first LED strips 10 by the holder onto a second substrate 300. Holder 200 can release first LED strips 10, which are lifted from first substrate 100 and placed onto second substrate 300, which can be a Si substrate. In this case, the first LED strips 10 can be affixed to second substrate 300 via a second adhesive layer 310. Second adhesive layer 310 includes, i.e. a wax layer. As illustrated in FIG. 6, two (2) first LED strips 10 are placed to have a distanced from one another so that other colors of second LED strip 20 and third LED strip 30 can be placed therebetween.

Figure 7:
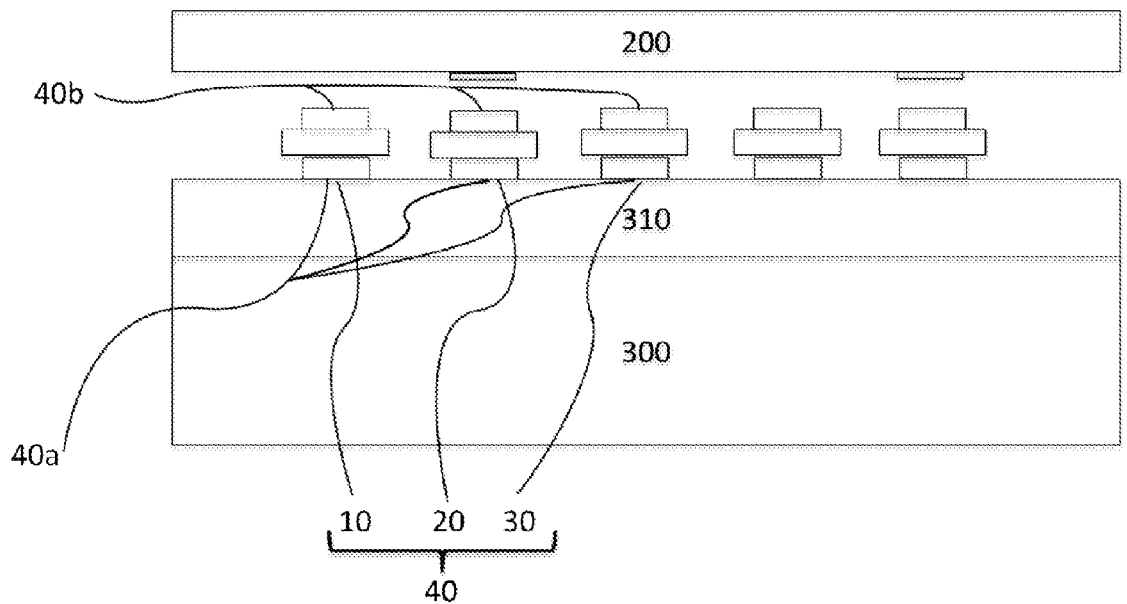
FIG. 7 is a section view illustrating an array of LED strips disposed on a second substrate.
Figure 8:
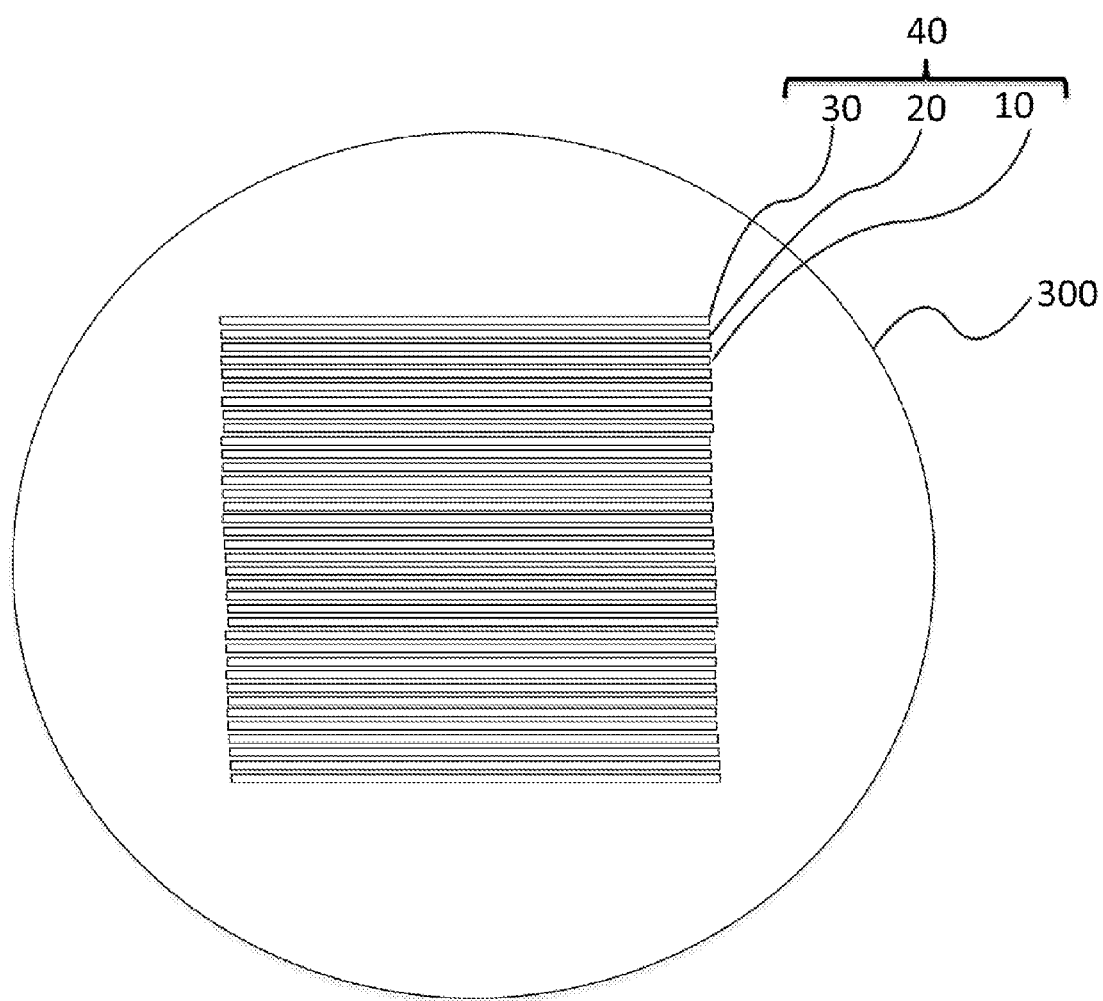
FIG. 8 is a plane view of FIG. 7.

FIG. 7 is a section view illustrating an array of LED units 40 disposed on a second substrate 300. FIG. 8 is a plan view of FIG. 7. In the performing step (S3), the steps of providing (S1) and transferring (S2) are performed at least once with respect to each of second LED strip 20 and third LED strip 30 until an array of LED units 40 is arranged on second substrate 300. Array of LED units 40 is comprised of at least one unit having the three primary colors, i.e. red, green, and blue.

Array of LED units 40 is comprised of a part of the at least one of first LED strip 10, second LED strip 20, and third LED strip 30. First surface 10a and second surface 10b of the plurality of LED elements 10, 20, and 30 are disposed to face in same direction of a first surface 40a and a second surface 40b of array of LED units 40. Here, array of LED units 40 includes first LED strip 10, second LED strip 20, and third LED strip 30. Second substrate 300 is in contact with first surface 40a of array of LED units 40. As illustrated, first LED strip 10, second LED strip 20, and third LED strip 30 are placed in parallel to each other in a repeating RGB/RGB/RGB pattern. The pitch of each of the LED unit 40 is equal to or smaller than 100 µm. In particular, the pitch the LED unit 40 is equal to or smaller than 50 µm.

Figure 9:
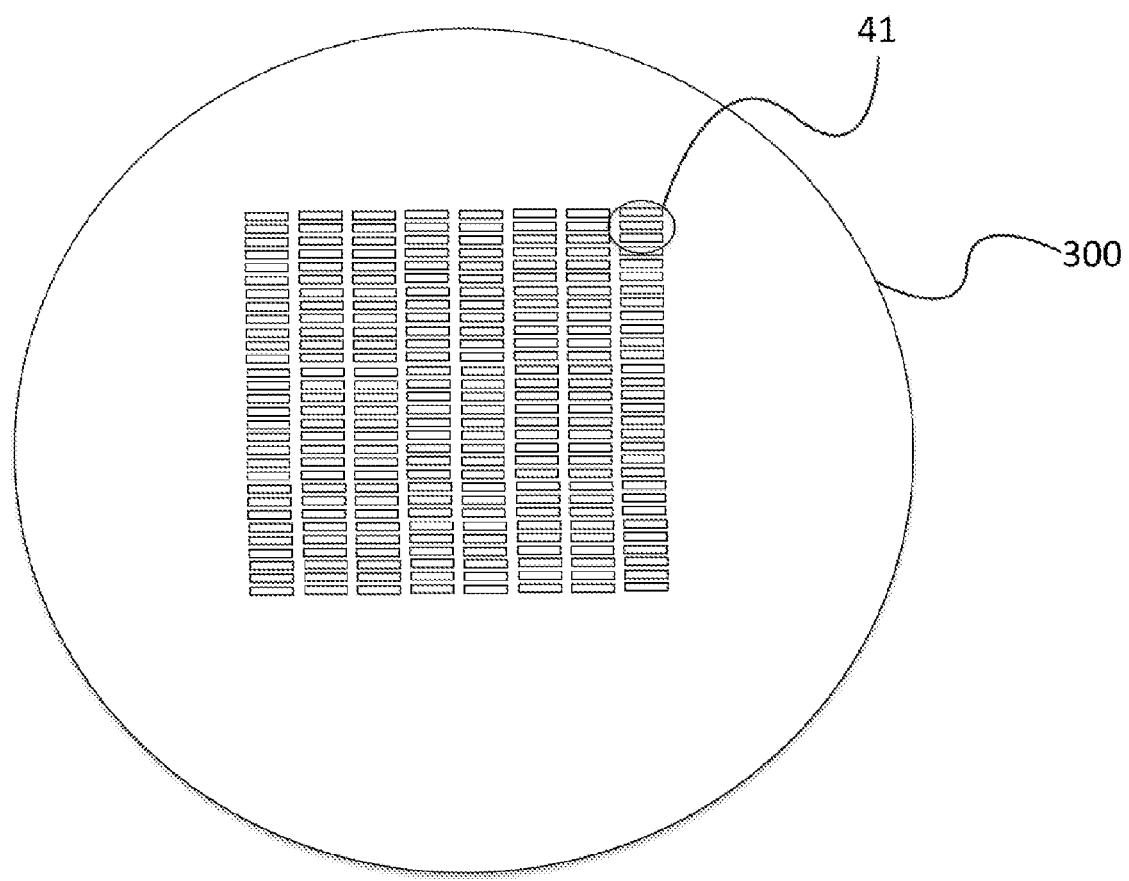
FIG. 9 illustrates an array of LED units on second substrate after LED strips in FIG. 8 are divided into LED pixels using techniques such as lithographic etching.

FIG. 9 illustrates the pattern of array of LED units 41 on second substrate 300 after a procedure such as lithographic etching. The method according to the embodiment of the present disclosure can further include a forming step. The forming step forms pixels from array of LED units 40 on second substrate 300 by a lithographic etching method. If array of LED units 40 is comprised of single unit pixels instead of strip, the lithographic etching process can be omitted. For instance, after etching process, a strip generally divided into a plurality of pixels as shown in FIG. 9. However, if a strip is provided with a plurality of pixels or with a singular pixel, lithographic etching process is not necessary. In such case, the pattern of array of LED units 41 can have same meaning with array of LED units 40. Hereinafter, array of LED units 40 is interchangeably used with the pattern of array of LED units 41. The pitch of each of the LED unit 41 is equal to or smaller than 100 µm. In particular, the size the LED unit 41 is equal to or smaller than 50 µm.

Figure 10:
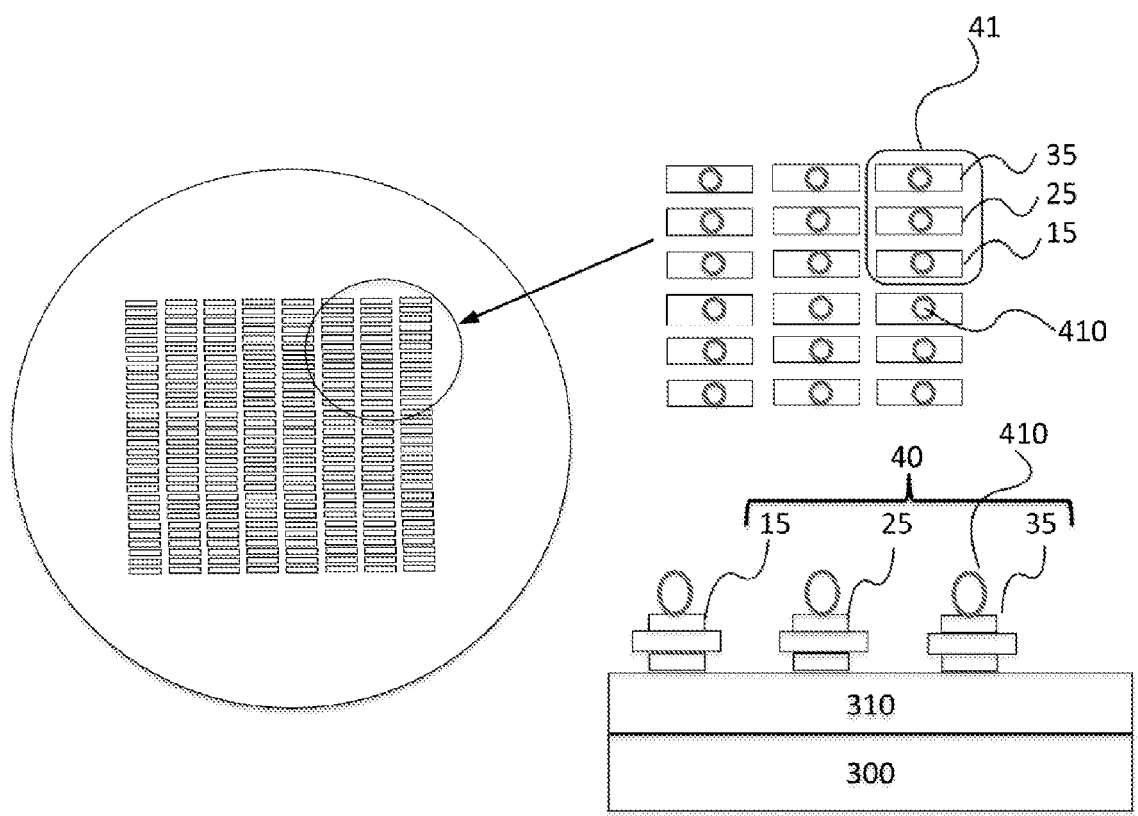
FIG. 10 shows that a third adhesive member is placed onto each of the LED pixels for bonding.
Figure 11:
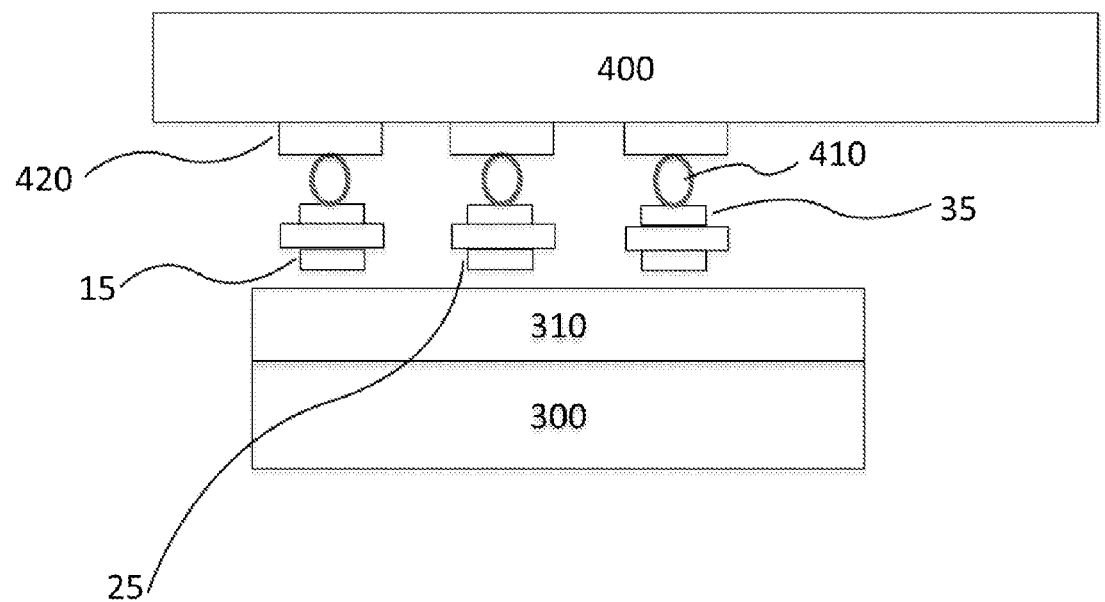
FIG. 11 shows one method for attaching array of LED units onto a third substrate.

FIG. 10 shows that a third adhesive member 410 is placed onto each of the LED pixels 15, 25, and 35 for bonding. FIG. 11 shows one method for attaching array of LED units 40 onto a third substrate 400. In the providing the third substrate step (S4), a third adhesive member 410 is provided between array of LED units 40 and third substrate 400. Third adhesive member 410 can be any material suitable for bump bonding. For instance, the adhesive member 410 can be indium bumps. First LED strip 10, second LED strip 20, and third LED strip 30 are divided into a plurality of first LED pixels 15, second LED pixels 25, and third LED pixels 35 after the lithographic etching method. If each of first LED strip 10, second LED strip 20, and third LED strip 30 is provided as a single unit pixel, each of first LED strip 10, second LED strip 20, and third LED strip 30 is same with each of first LED pixels 15, second LED pixels 25, and third LED pixels 35, respectively. Each of array of RGB LED units 40 includes a first LED pixel 15, a second LED pixel 25, and a third LED pixel 35. If each of first LED strip 10, second LED strip 20, and third LED strip 30 includes a singular pixel or LED element, each of first LED strip 10, second LED strip 20, and third LED strip 30 would be same with the first LED pixel 15, the second LED pixel 25, and the third LED pixel 35, respectively.

Referring to FIG. 11, in the detaching step (S5), second substrate 300 is detached from the first LED pixels 15, second LED pixels 25, and third LED pixels 35 or array of LED units 40.

Third substrate 400 is heated so that its heat melts the third adhesive member 410, i.e. indium bumps on each of first LED pixel 15, second LED pixel 25, and third LED pixel 35. Third substrate 400 is then cooled down so that third adhesive member 410, i.e. indium bumps bonds third substrate 400 with first LED pixel 15, second LED pixel 25, and third LED pixel 35. Third substrate 400 is an LED driver IC wafer so that electronic components or circuitry can be coupled thereto. Second adhesive layer 310 is then heated so that second adhesive layer 310, i.e. wax melts and releases first LED pixel 15, second LED pixel 25, and third LED pixel 35 to third substrate 400.

Figure 12:
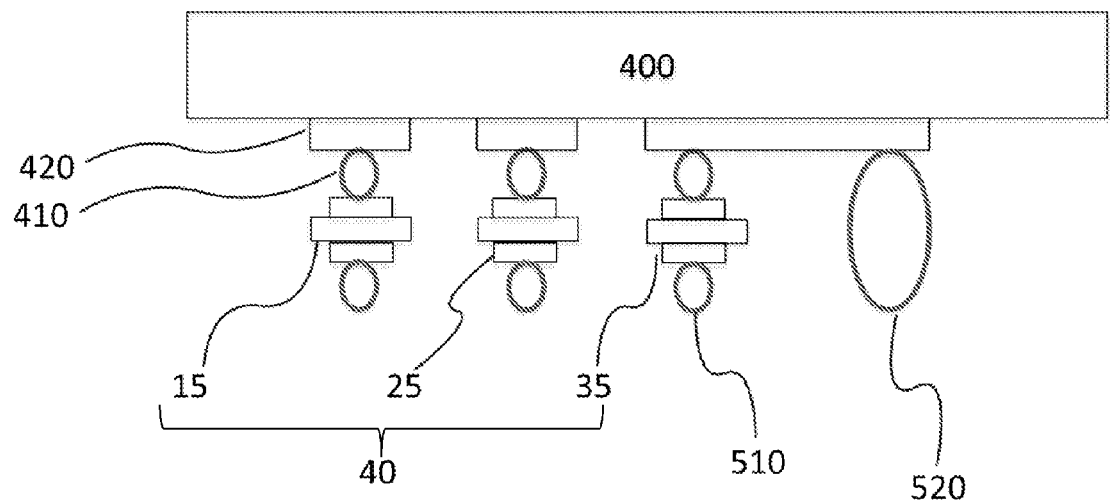
FIG. 12 shows that a fourth adhesive member is placed onto array of LED units for bonding.
Figure 13:
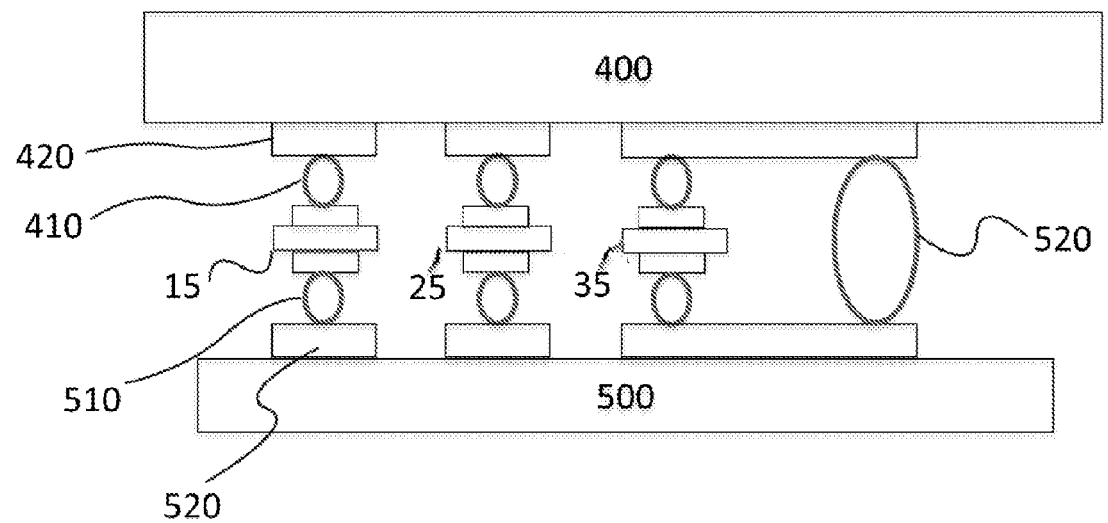
FIG. 13 shows one method for attaching array of LED units onto a fourth substrate.

FIG. 12 shows that a fourth adhesive member 510 is placed onto array of LED units 40 for bonding. FIG. 13 shows one method for attaching array of LED units 40 onto a fourth substrate 500. In the providing the fourth substrate step (S6), fourth substrate 500 is provided onto first surface 40*a* of array of LED units 40.

Referring to FIG. 12, third adhesive member 410, e.g. indium bump, is used to bond third substrate 400, which comprises an LED driver circuitry. Interconnecting electrodes and traces 420 can be disposed between third adhesive member 410 and third substrate 400. Fourth adhesive member 510 is provided first surface 40*a* of array of LED units 40. Fifth adhesive member 520 can be provided to connect circuitry on third substrate 400 and circuitry on fourth substrate 500. Fourth substrate 500 can be of any known material suitable for an LED display, such as a sheet of glass or a touchpad panel.

Figure 14A:
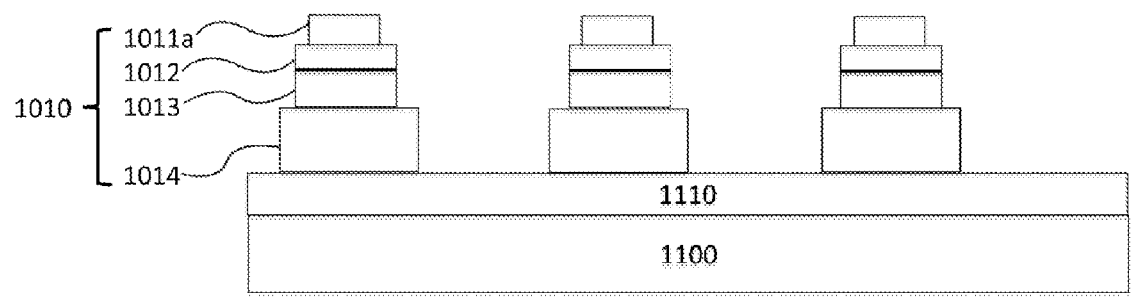
FIG. 14a is a section view of first LED strips on first substrate.
Figure 14B:
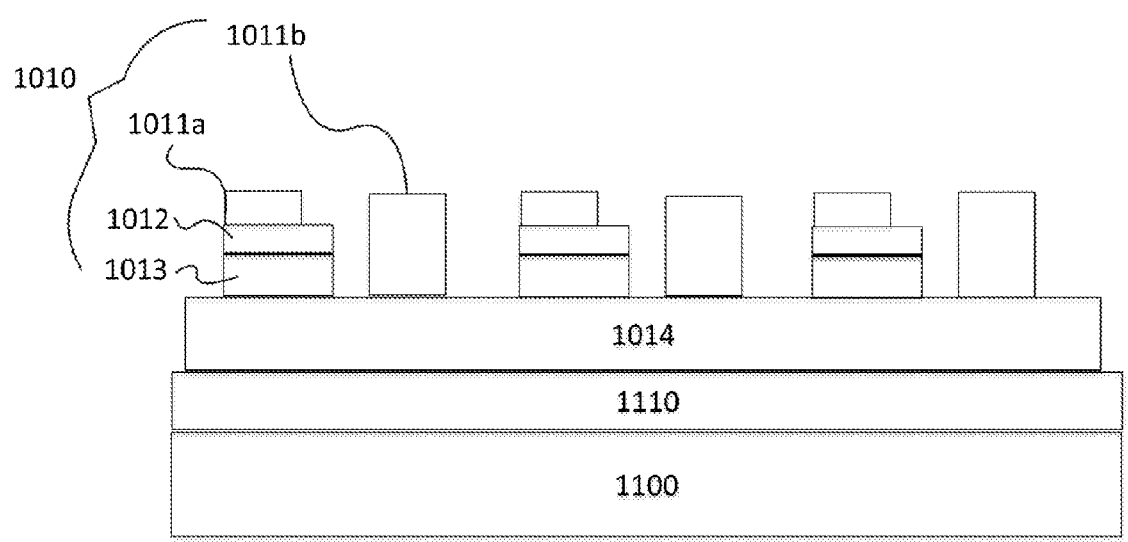

FIGS. 14*a-d* illustrate another embodiment of the present disclosure. FIG. 14*a* is a section view of first LED strips 1010 on first substrate 1100. FIG. 14*b* is another section view taken from a view normal to the one for FIG. 14*a*. FIGS. 14*a* and 14*b* show first LED strips 1010 on first substrate 1100 via a first adhesive layer 1110. FIGS. 14*a* and 14*b* illustrate lateral LED strips 1010. As shown in FIG. 14*a*, the first LED strip 1010 include metal electrodes 1011 on P-type GaN or AlInGaP 1012, which in turn resides on a layer of light emitting material 1013. The light emitting material 1013 layer is disposed on N-type GaN or AlInGaP layer 1014.

In another embodiment as shown in FIG. 14*b*, a first LED strip 1010 includes metal electrodes 1011*a* and 1011*b*, P-type GaN or AlInGaP layer 1012, a light emitting material layer 1013. The first LED strip 1010 is disposed on an N-type GaN or AlGaP layer.

Figure 14C:
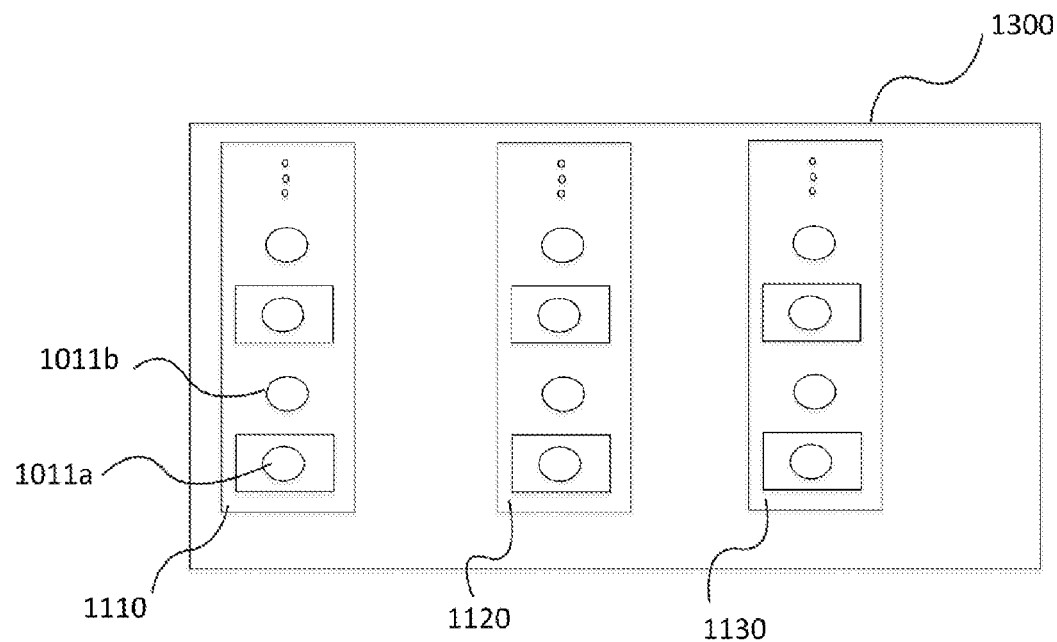
FIG. 14c shows first LED strip, second LED strip, and third LED strip disposed on third substrate.

FIG. 14*c* shows first LED strip 1010, second LED strip 1020, and third LED strip 1030 disposed on third substrate 1300. Transferring each of first LED strip 1010, second LED strip 1020, and third LED strip 1030 onto the third substrate 1300 can be performed in the similar method explained with respect to FIGS. 4-7.

Figure 14D:
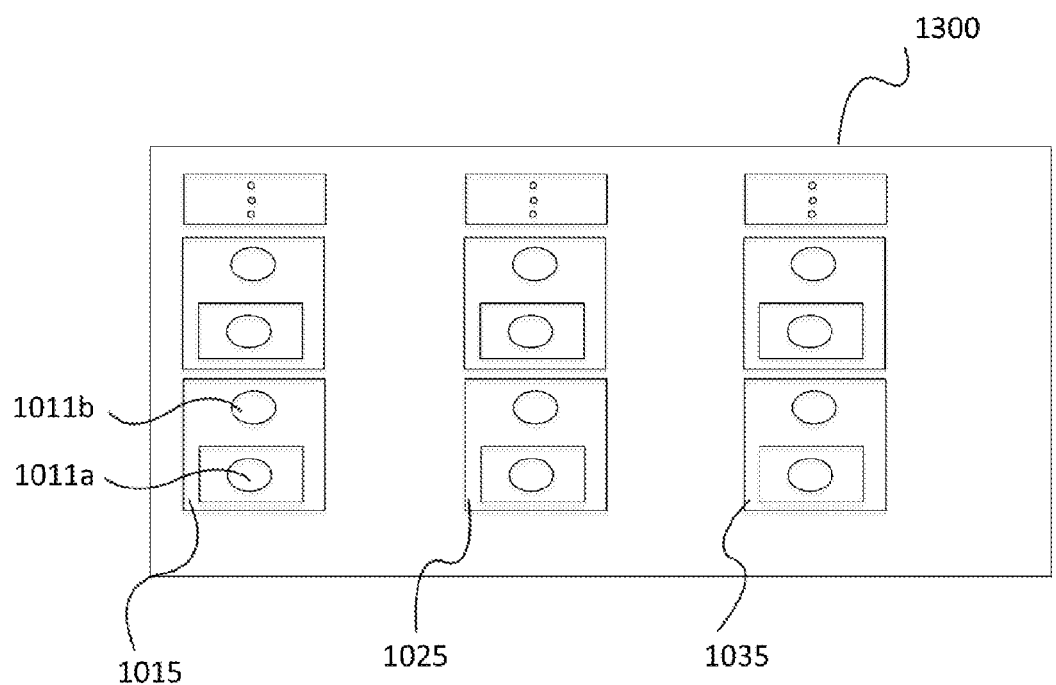
FIG. 14d shows the pattern of LED strips on third substrate after an etching process.
Figure 15:
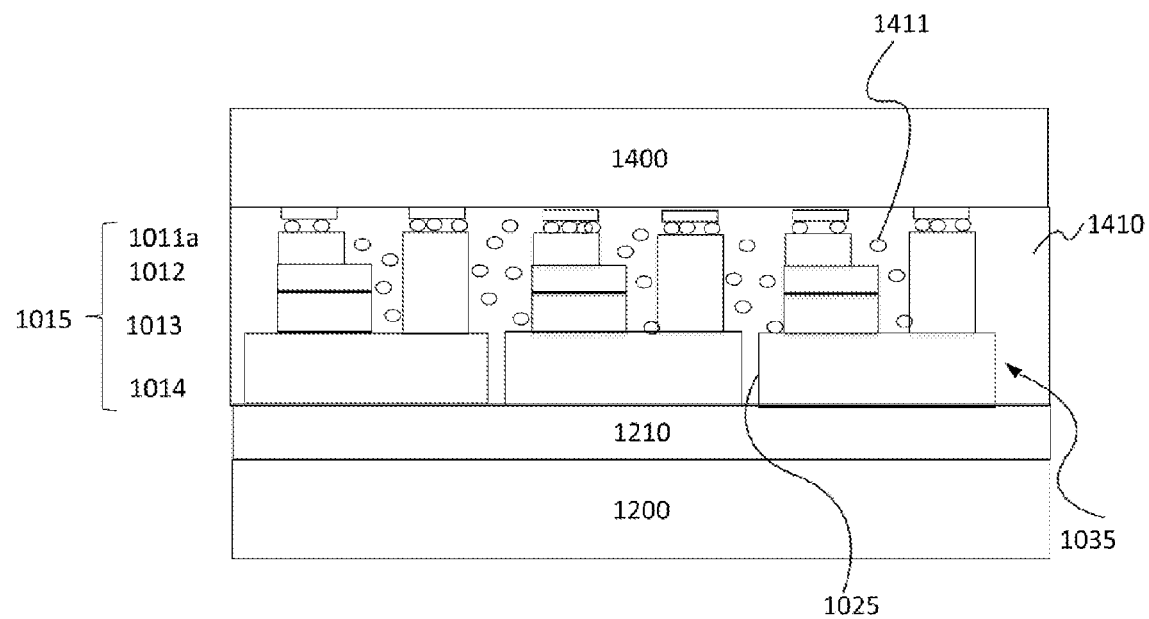
FIG. 15 illustrates third substrate bond to the LED strips via anisotropic conductive film (ACF).

FIG. 14*d* shows the pattern of array of RGB LED units 1015, 1025, and 1035 on third substrate 1300 after an etching process. FIG. 15 illustrates third substrate 1400 bond to the RGB LED pixels 1015, 1025, and 1035 using the anisotropic conductive film (ACF) technology. ACF technology can be used for higher signal densities and smaller overall packages. In an ACF process, an anisotropic material can be first deposited on a base substrate. This may be done using a lamination process for ACF, or either dispense or printing process for ACP. The device or secondary substrate can be then placed in position over the base substrate and the two surfaces can be pressed together to mount the secondary substrate or device to the base substrate. In many cases this mounting process is done with no heat or a minimal amount of heat that is just sufficient to cause the anisotropic material to become slightly tacky. For bonding, the amount of thermal energy required is higher due to the need to first flow the adhesive and allow the two surfaces to come together into electrical contact, and then to cure the adhesive and create a lasting reliable bond. The temperatures, times, and pressure required for these processes can vary. ACF can be used when electrical connection is made at smaller gap between the electrodes. In this case, pitch size can depends on particle size. Nano metal particles can be used for several micron size pitch. For lateral LED strips, since the electrodes are on the same surface of the LED strip, the ACF can be applied only once to attach both N- and P-type electrodes. In the case of vertical LED strips, the ACF can be applied twice, one application for attaching the electrodes on each surface. Between the two applications, insulating epoxy can also be employed to ensure no shorting between the two ACFs. Using ACF this way may significantly simplify the packaging process. For example, the providing the third substrate step (S4) can be performed via anisotropic conductive films (ACF) method.

In the embodiment of FIG. 15, RGB LED pixels 1015, 1025, and 1035 are placed between the third substrate 1400 (e.g., a driver wafer) and the second substrate. A second adhesive layer 1210 is interposed between ACF layer 1410 and second substrate 1200. CF layer 1410 is an anisotropic adhesive film or paste, which contains nano-sized conductive particles.

Figure 16:
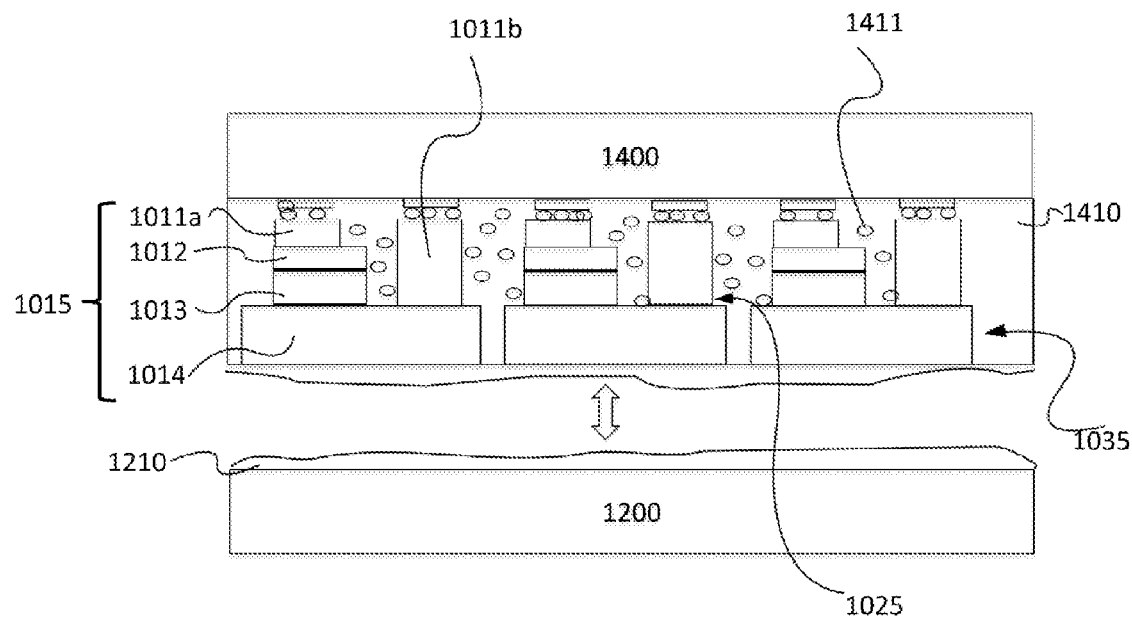
FIG. 16 shows that second substrate is detached by melting second adhesive layer.

FIG. 16 shows that second substrate 1200 is detached by melting second adhesive layer 1210. Second adhesive layer 1210 can be heated and melt so that second substrate 1200 can be detached.

Figure 17:
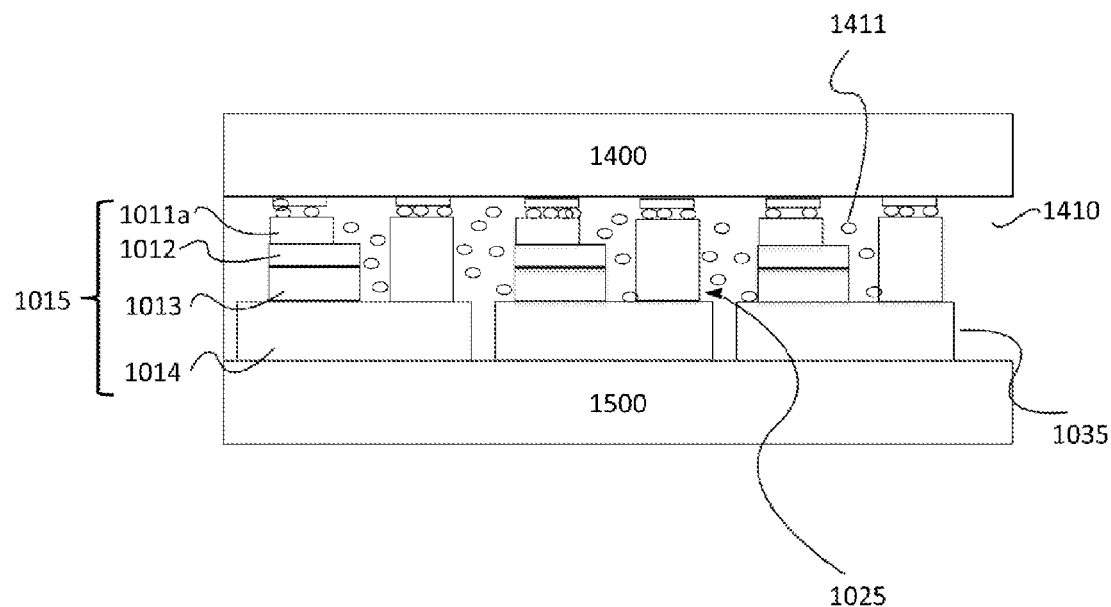
FIG. 17 shows a fourth substrate being attached to the LED strips.

FIG. 17 shows a fourth substrate 1500 being attached to the RGB LED pixels 1015, 1025, and 1035. Fourth substrate 1500 is can be a glass panel or a touchpad panel. According to this method, first LED pixel 1015 (or a red LED element), second LED pixel (or a green LED element) 1025, and third LED pixel (or a blue LED element) 1035 are disposed on fourth substrate 1500 in a row with a pitch (P) smaller than a predetermined distance, e.g., 100 µm or 50 µm or smaller.

Figure 18:
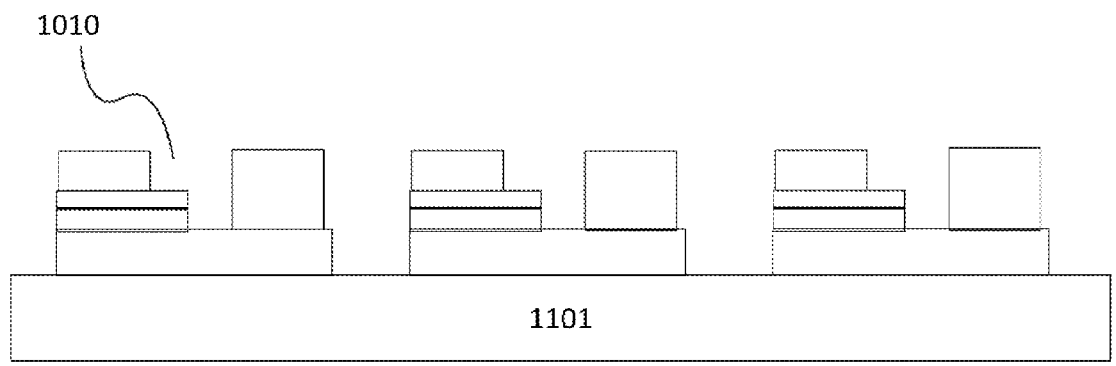
FIG. 18 is a section view of LED strips attached on first substrate according to another embodiment of the present disclosure.

FIG. 18 is a section view of LED strips 1010 attached on first substrate 1101 according to another embodiment of the present disclosure. First substrate 1101 is either a sapphire substrate or a transparent substrate. Thus, LED strips 1010, the light emitting layer, GaN, InGaN, or other structural elements can be grown on a sapphire substrate. Accordingly, LED strips 1010, electrodes, and other necessary devices can be fabricated on the sapphire substrate as shown in FIG. 18. This embodiment is particularly suitable for picking up and placing LED strips 1010 using a holder 200 being a magnetic pick up head because, for example, a lazier lift off (LLO) method can be used. The LLO method is described with reference to FIGS. 19 and 20.

Figure 19:
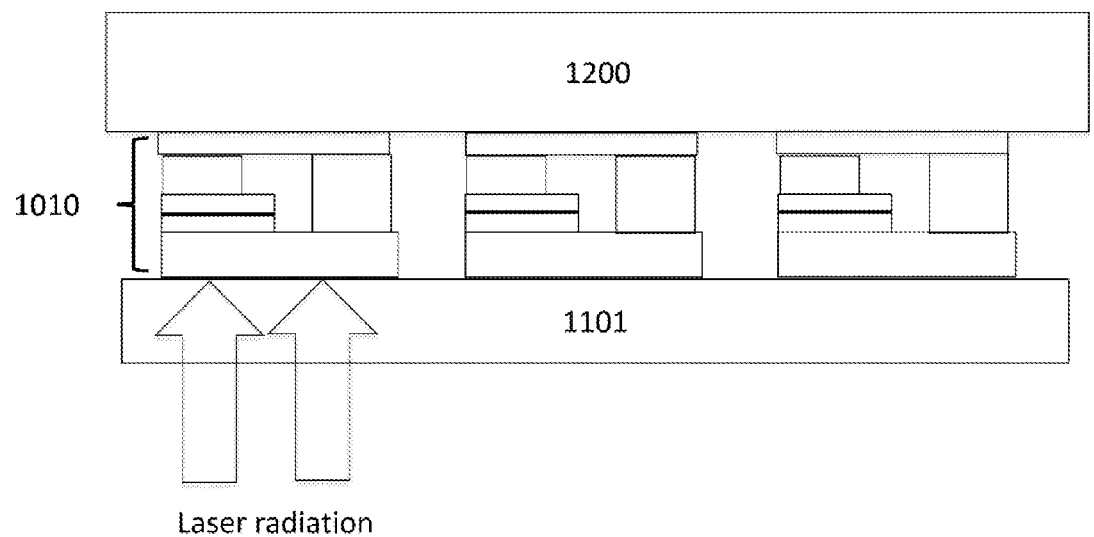
FIG. 19 shows a method for detaching green and blue LED strips from GaN by a Laser Lift-Off (LLO) method.

FIG. 19 shows a method for detaching green and blue LED strips from GaN by LLO method. Since first substrate 1101 is a sapphire substrate, which is transparent to laser while GaN is not, Laser Lift-Off (LLO) can be used to separate the devices from the sapphire substrate. Referring to FIG. 19, the LED strips 1010 are attached to holder 200 being a magnetic pick up head while a laser beam passes through first substrate, i.e. sapphire substrate and targets GaN, which creates shockwaves that dissociates GaN from the sapphire substrate. Alternatively, UV Lift-Off may also be applied to separate the LED chips from the sapphire substrate. Thus, the transferring step (S2) can further include a LLO step to separate the at least two of the plurality of LED elements 10 from first substrate 100.

Figure 20:
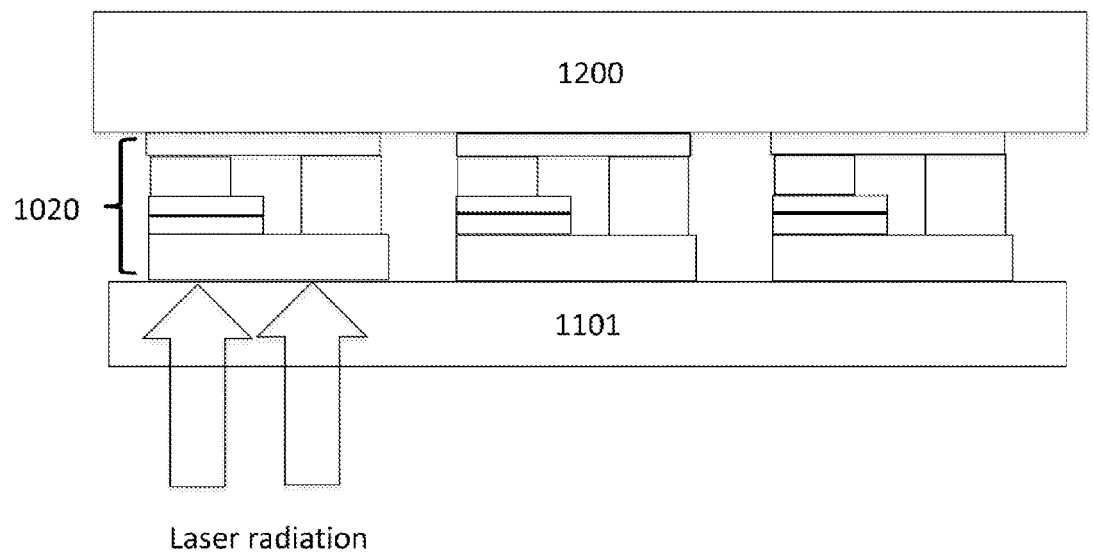
FIG. 20 shows a method for detaching red LED strips from first substrate by the LLO method.

FIG. 20 shows a method for detaching red LED strips from first substrate using Laser Lift-Off. In this case, AlIn-GaP red LED strips 1020 are attached to first substrate 1101, i.e. sapphire substrate, by Van der Waals force. By selecting a laser that is absorbed at the interface of first substrate 1101, i.e. the sapphire substrate, red LED strips 1020 can be detached from first substrate 1101.

Figure 21:
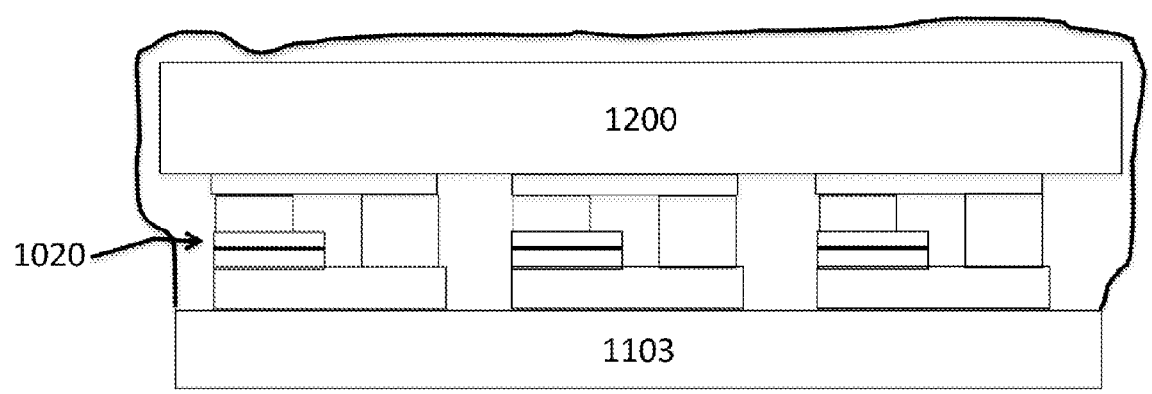
FIG. 21 is a section view of LED strips interposed between first substrate and second substrate according to another embodiment of the present disclosure.

FIG. 21 is a section view of first LED strips 1010 interposed between first substrate 1103 and second substrate 1200 according to another embodiment of the present disclosure. First substrate 1103 is GaAs substrate and second LED strips 1020 are disposed thereon. Second LED strips 1020 can be separated from first substrate 1103, i.e. GaAs substrate by an etching processing using ammonia hydroxide or other suitable means. With respect to the transferring step (S2), it can further include etching first substrate 1103 by using ammonia hydroxide to separate the at least two of the plurality of LED elements 1010, 1020, and 1030 from first substrate 1103.

Figure 22:
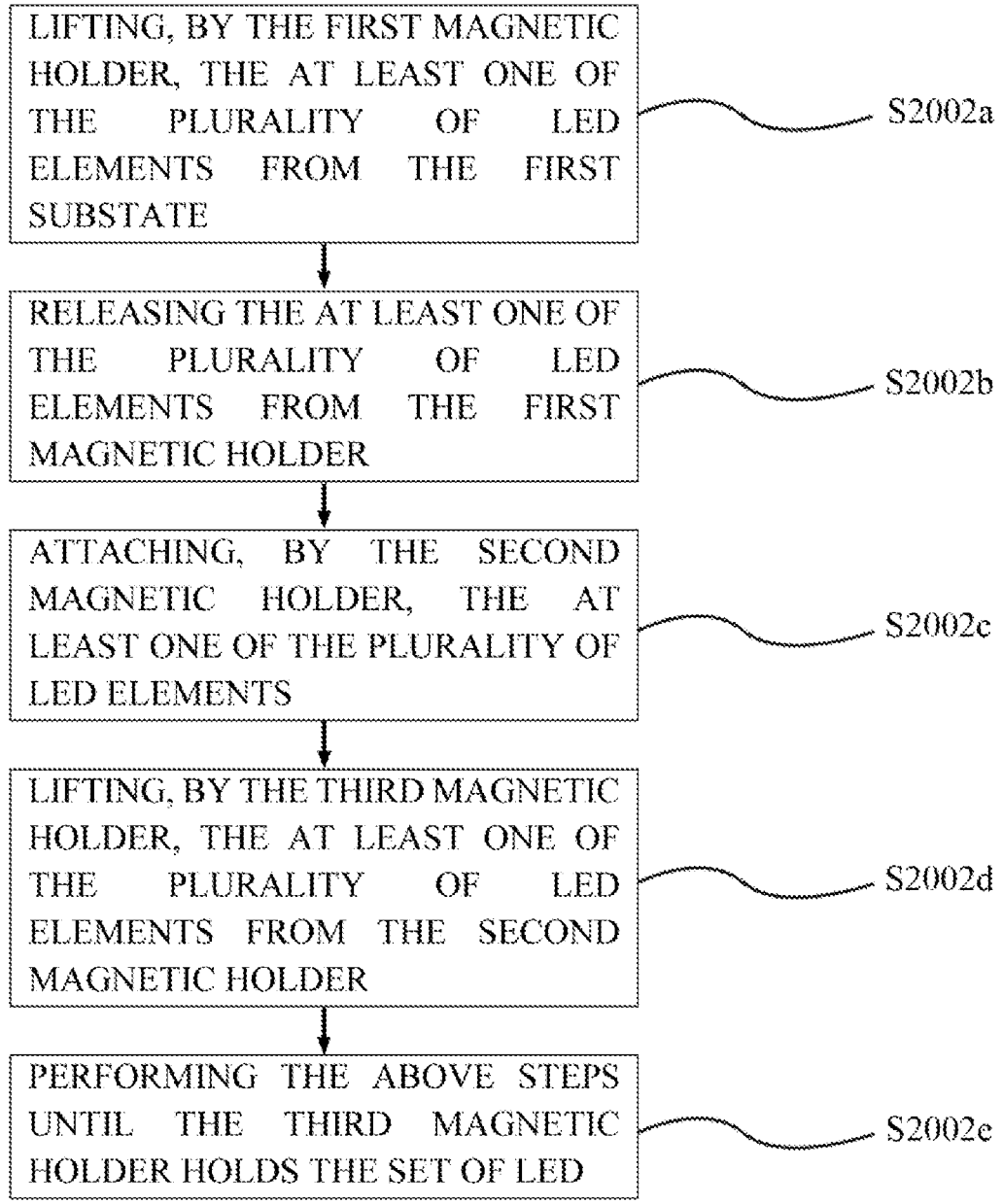
FIG. 22 is a flow chart of the transferring step (S2).

With reference to FIGS. 22-27, the transferring step (S2) according to another embodiment of the present disclosure is described. FIG. 22 is a flow chart of the transferring step (S2).

Holder 200 may include a first magnetic holder 2210, a second magnetic holder 2220, and a third magnetic holder 2230. First magnetic holder 2210 and second magnetic holder 2220 are the solid state magnetic pick up heads. Third magnetic holder 2230 is a RGB magnetic pixel holder. The transferring according to another embodiment of the present disclosure, includes the following five steps (S2002a-S2002e).

In a first lifting step (S2002a), first magnetic holder 2210 lifts at least two of the plurality of LED elements 2010 (or first LED strip 2010) from first substrate 100. First magnetic holder 2210 is in contact with second surface 10b of at least two of the plurality of first LED elements 2010 (or first LED strip 2010).

In a releasing step (S2002b), first magnetic holder 2210 moves to a place which corresponds to second magnetic holder 2220 and selectively releases at least two of the plurality of first LED elements 2010 (or first LED strip 2010) onto the second magnetic holder 2220.

In an attaching step (S2002c), second magnetic holder 2220 receives and attaches at least two of the plurality of first LED elements 2010 (or first LED strip 2010) (S2002d) from first magnetic holder 2210 thereto. First magnetic holder 2210 then moves away.

In a second lifting step (S2002d), third magnetic holder 2230 is located that at least two of the plurality of first LED elements 2010 (or first LED strip 2010) is interposed between second magnetic holder 2220 and third magnetic holder 2230. Third magnetic holder 2230 lifts at least two of the plurality of first LED elements 2010 (or first LED strip 2010) from second magnetic holder 2220.

Last step (S2002e) is to repeatedly perform the above steps (S2002a-S2002d) until the third magnetic holder holds the array of LED units.

Figure 23:
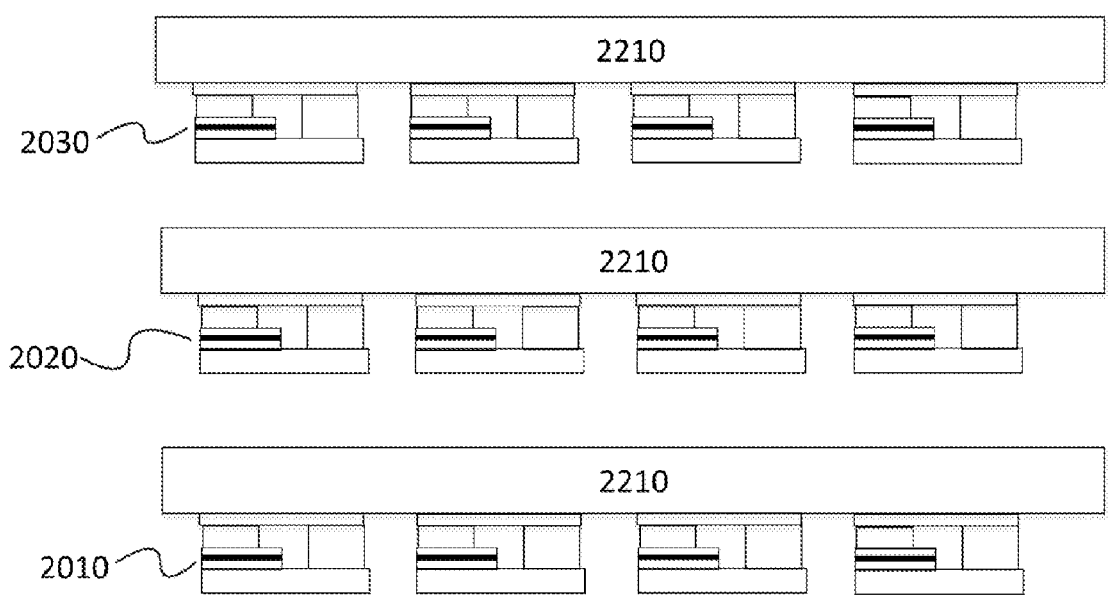
FIG. 23 is a section view of LED strips attached to first magnetic holder.

FIG. 23 is a cross section view of LED strips 2010, 2020, and 2030 attached to first magnetic holder 2210. FIG. 23 describes the first lifting step (S2002a). First LED strips 2010, second LED strips 2020, and third LED strips 2030 are separated from their respective first substrates (not shown in FIGS. 23-27) and are attached to respective first magnetic holders 2210.

Figure 24A:
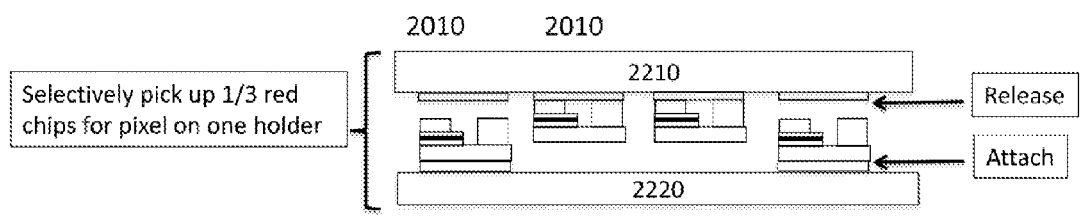
FIGS. 24a-24c are schematic diagrams illustrating the transferring method according to another embodiment of the present disclosure.
Figure 24B:
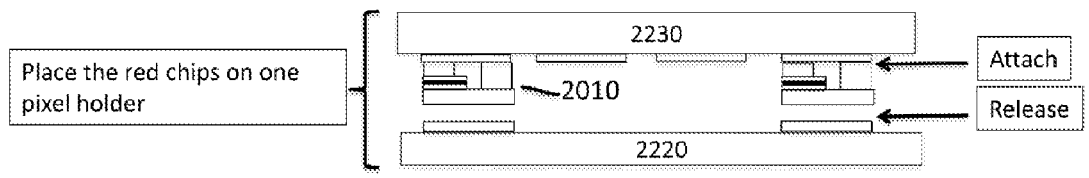
Figure 24C:
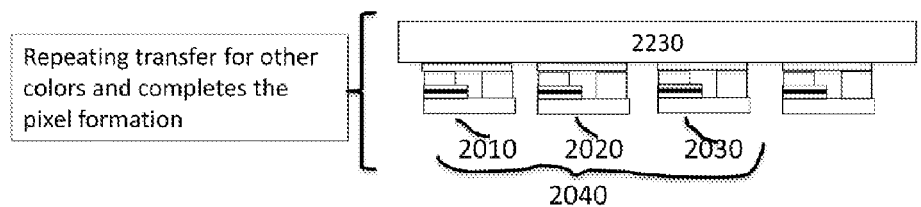

FIGS. 24a-24c are cross section view illustrating the transferring method according to another embodiment of the present disclosure. FIG. 24a describes the releasing step (S2002b) and the attaching step (S2002c). FIG. 24b describes the second lifting step (S2002d). FIG. 24c describes the last step (S2002e).

Since LED strips 2010, 2020, and 2030 are attached to first, second and third magnetic holders 2210, 2220, and 2230 when solid state coils in first, second and third magnetic holders 2210, 2220, and 2230 are energized with electrical current (see, e.g., FIG. 4), they can be selectively attached or released by energizing or shutting-off certain solid state coils in first, second and third magnetic holders 2210, 2220, and 2230. In FIG. 24, the pair of first magnetic holder 2210 holds a plurality of first LED strips 2010 while second magnetic holder picks up one third of the first LED strips from first magnetic holder 2210. Second magnetic holder 2220 receives one third first LED strips 2010 from first magnetic holder 2210 and places first LED strips 2010 on third magnetic holder 2230. The same process can be repeated to pick up second LED strips 2020 and third LED strips 2030 and place them on third magnetic holder 2230. Once completed, all three types of first, second, and third LED strips are released to a fourth magnetic holder 2240.

Figure 25:
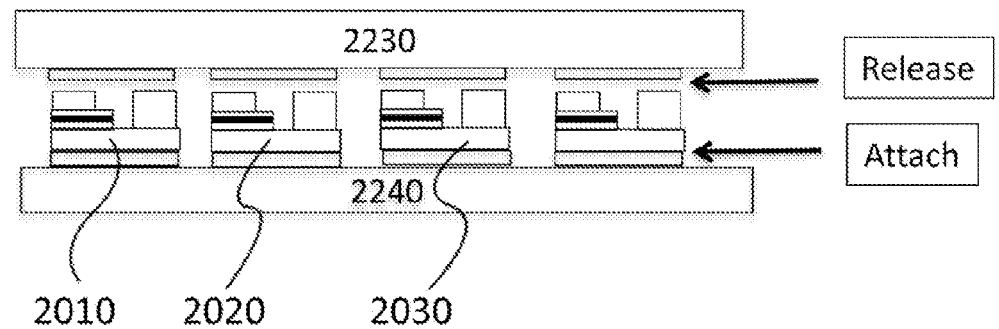
FIG. 25 is a section view of LED strips disposed on fourth magnetic holder.

FIG. 25 is a brief section view of LED strips 2010, 2020, and 2030 disposed on fourth magnetic holder 2240. FIG. 25 has similar section view with FIG. 11. However, in FIG. 25, LED strips 2010, 2020, 2030 are held to fourth magnetic holder 2240 by magnetic power, not by adhesive layer, i.e. wax. Third magnetic holder 2230 can then be detached from LED strips 2010, 2020, and 2030 by turning off the magnetic field therefrom.

Figure 26:
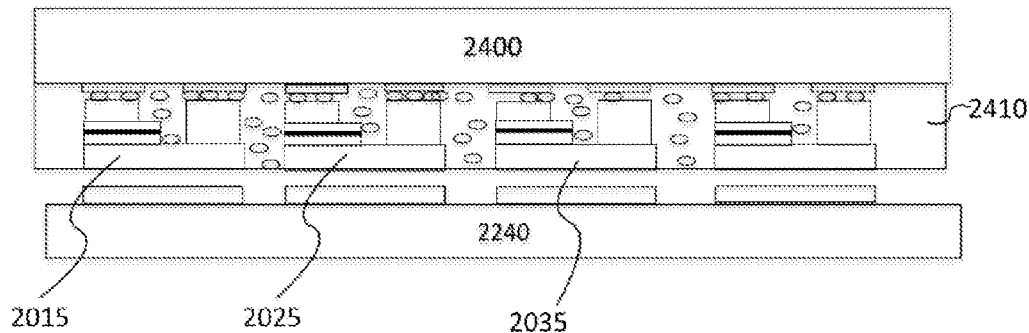
FIGS. 26 and 27 are brief section views of LED strips filled with anisotropic conductive film (ACF) layer.
Figure 27:
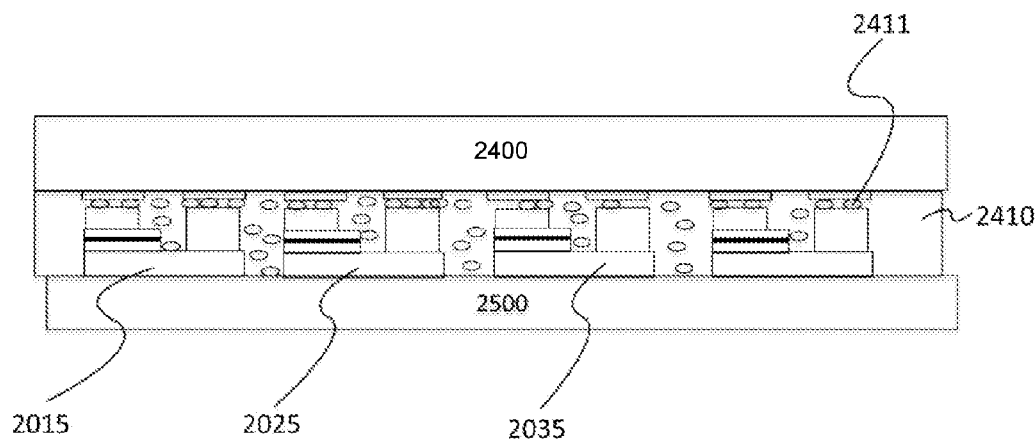

FIG. 26 is a brief section view of LED RGB pixels 2015, 2025, and 2035 filled with anisotropic conductive film (ACF) layer 2410. Fourth substrate 2400 is placed on a place where third magnetic holder 2230 is detached. LED strips can be filled with anisotropic conductive film (ACF). After ACF method is performed, fourth magnetic holder 2240 can be detached from LED pixels 2015, 2025, and 2035 by turning off the magnetic field therefrom. Here, differing from the process steps shown in FIGS. 16 and 17, no adhesive layer is needed. Accordingly, it is not necessary to clean adhesive layer before attaching the fifth substrate 2500, i.e. cover glass to RGB LED pixels 2015, 2025, and 2035, as shown in FIG. 27. Conductive particle 2411 is nano-sized metal particles. ACF layer 2410 is an anisotropic adhesive film or paste.

FIGS. 28-35 illustrate methods for testing and replacing LED strips 3010, 3020, and 3030 with a vacuum holder 3220 according to the other embodiment of the present disclosure.

Figure 28:
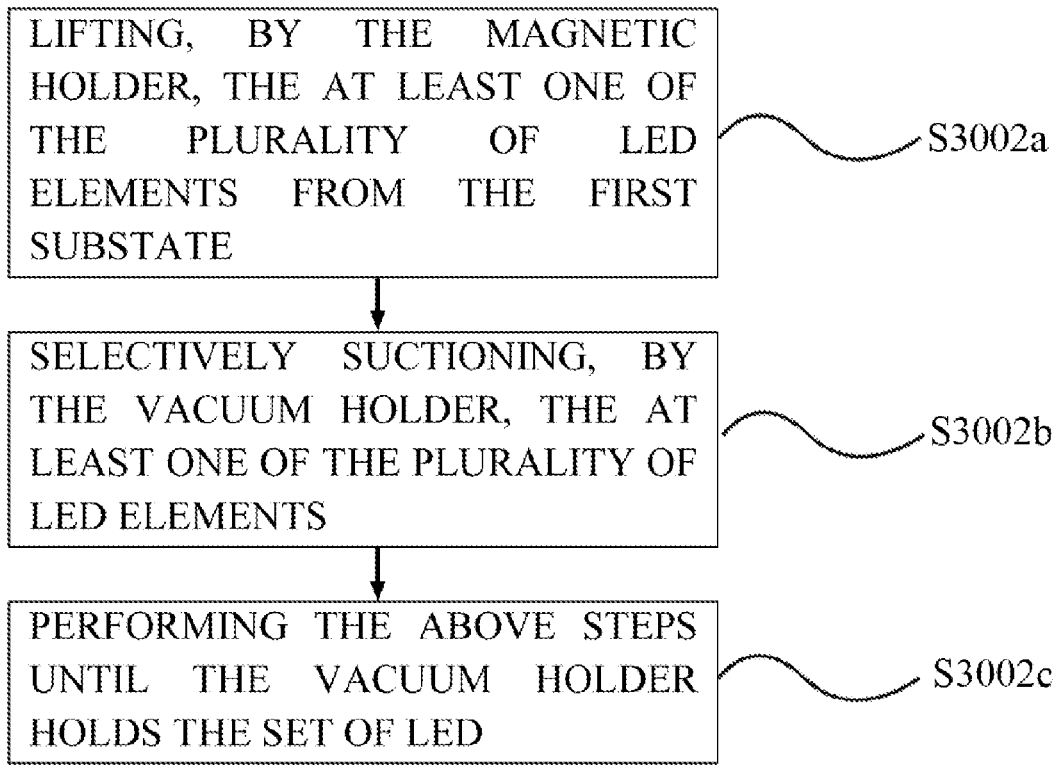
FIGS. 28-35 illustrate methods for testing and replacing LED strips with a vacuum holder according to the other embodiment of the present disclosure.

FIG. 28 is a flow chart for the transferring step according to the other embodiment of the present disclosure. Holder 200 includes a magnetic holder 3210 and a vacuum holder 3220. Referring to FIG. 28, the transferring step includes three (3) steps (3002a-3002c). In a lifting step (3002a), magnetic holder 3210 lifts at least two of the plurality of first LED elements 3010 (or first LED strip 3010) from first substrate 100. Magnetic holder 3210 is in contact with second surface 10b of at least two of the plurality of LED elements 3010 (or first LED strip 3010).

In a suctioning step (3002b), vacuum holder 3220 holds at least two of the plurality of LED elements 3010 (or first LED strip 3010). Vacuum holder 3220 is in contact with first surface 10a of at least two of the plurality of LED elements 3010 (or first LED strip 3010).

In last step (3002c), it is repeatedly performs the above steps (3002a and 3002b) until vacuum holder 3220 holds array of LED units 3040. LED strips 3010, 3020, and 3030 may be held and transported using vacuum holder 3220.

Figure 29:
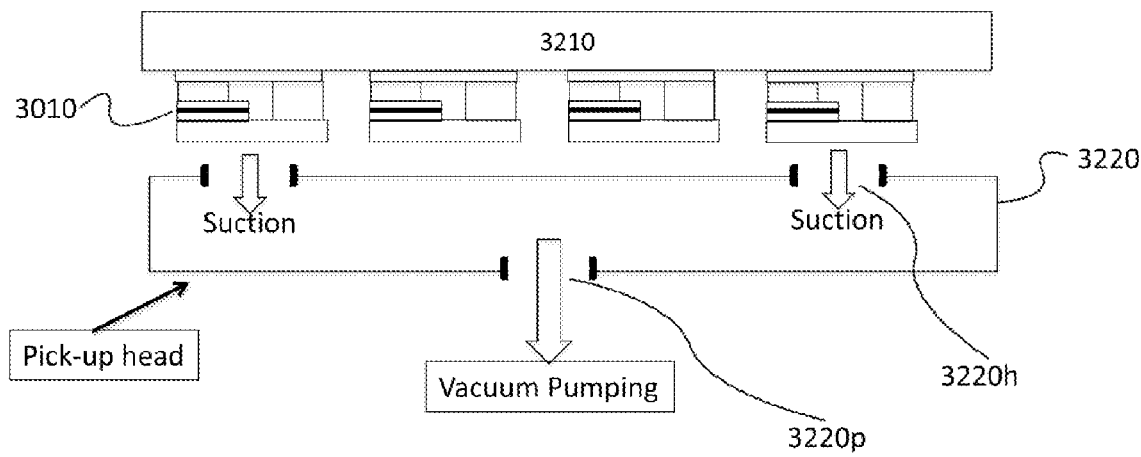
Figure 30:
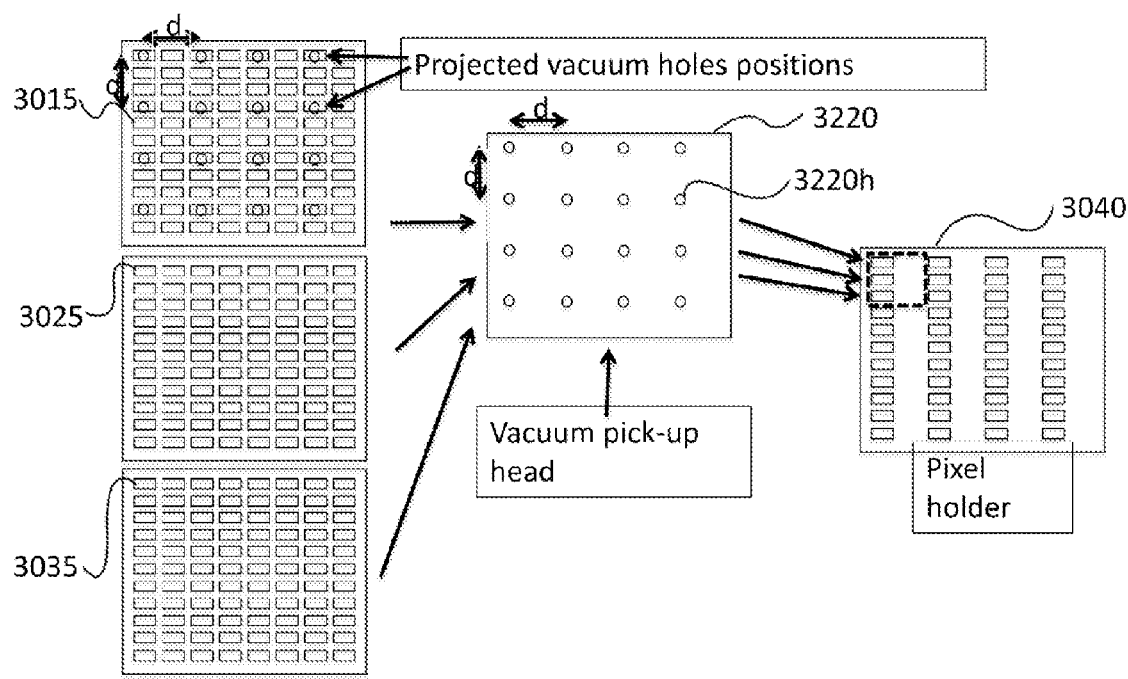

FIGS. 26-33 show a schematic of vacuum holder 3220. Vacuum holder 3220 may be a vacuum plate having a hollow inner chamber with suction orifices 3220h and vacuum pump 3220p. One surface of the vacuum plate has a plurality of suction orifices 3220h connected to the inner chamber while the other surface of the plate is connected to vacuum pump 3220p. When in use, vacuum orifices 3220h are aligned with RGB LED pixels 3015, 3025, and 3035 or patterns of LED strips (not shown) to be picked up. When the vacuum is on, the suction force pulls the RGB LED pixels 3015, 3025, and 3035 aligned with the vacuum orifices 3220h away from magnetic holder 3210, as shown in FIG. 29. The picked-up first LED pixel 3015 is attached to the vacuum holder 3220 for further manipulation.

Figure 31:
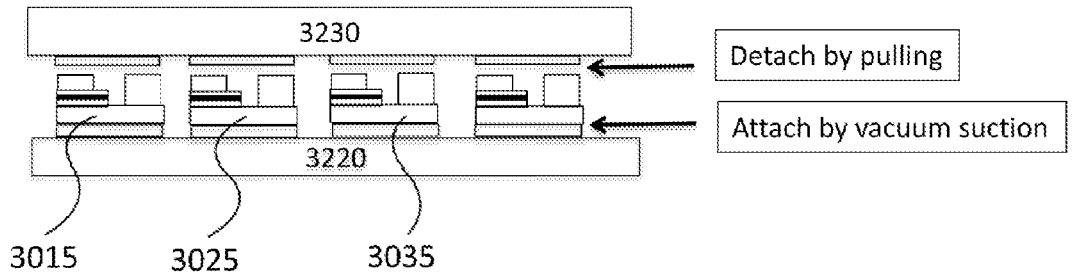

FIG. 31, third magnetic holder 3230 is placed on second surface 10b of RGB LED pixels 3015, 3025, and 3035. Third magnetic holder 3230 can be detached by turning off the magnetic field therefrom.

Figure 32:
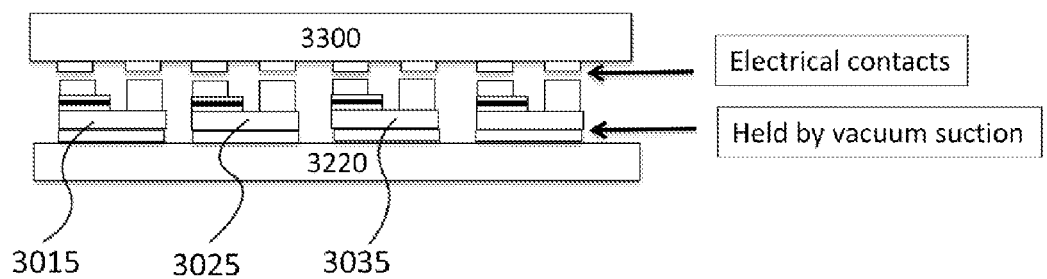

In the illustration in FIG. 32, third magnetic holder 3230 is detached and LED probe card 3300 is placed instead. The bonding pads of the RGB LED pixels 3015, 3025, and 3035 face outward when the RGB LED pixels 3015, 3025, and 3035 are attached to vacuum holder 3220. The bonding pads can then connect to a power source for testing the RGB LED pixels 3015, 3025, and 3035.

FIGS. 32-35 illustrate the process of testing and replacing RGB LED pixels 3015, 3025, and 3035. As shown in FIG. 32, LED probe card 3300 is used when testing RGB LED pixels 3015, 3025, and 3035. LED probe card 3300 has a plurality of electrical contacts that are connected to a power source. While RGB LED pixels 3015, 3025, and 3035 are attached to vacuum holder 3220, LED probe card 3300 is applied to RGB LED pixels 3015, 3025, and 3035 so that the electrical contacts come into contact with the LED strips to light them up. RGB LED pixels 3015, 3025, and 3035 fail to light up or otherwise show irregularities are identified as out of specification and their locations indexed for replacement.

Figure 33:
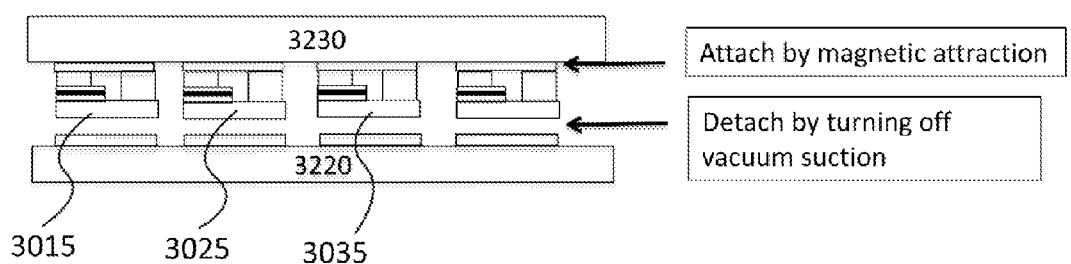
Figure 34:
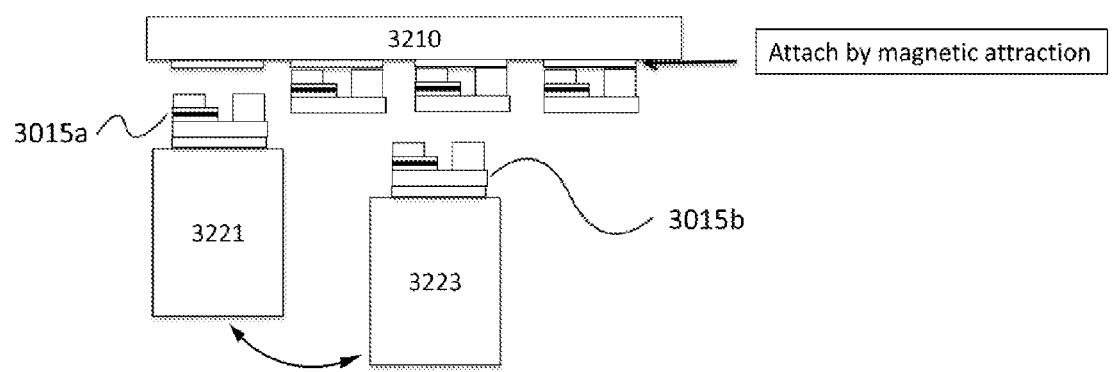
Figure 35:
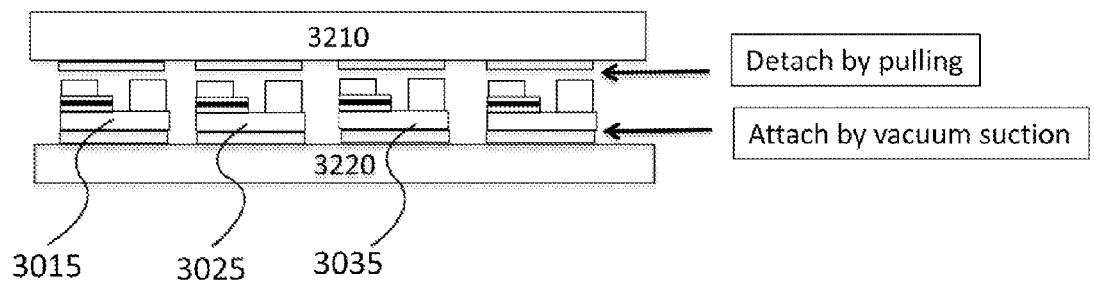

After testing, RGB LED pixels 3015, 3025, and 3035 are flipped back to third magnetic holder 3230 as shown in FIG. 33. It can be accomplished by simply aligning vacuum holder 3220 and third magnetic holder 3230 properly then turning of the vacuum. Since the suction force is turned off, the magnetic force from third magnetic holder 3230 pull the LED chips back from vacuum holder 3220. Once being transferred back to third magnetic holder 3230, the out-of-spec LED strips can be replaced. FIG. 34 shows a method using single chip suction head to replace out-of-spec chips one by one. In another embodiment, a multiple out-of-spec chips can be replaced using a vacuum suction head having multiple vacuum orifices. The vacuum orifices can be open or shut automatically according to the indexed locations of the out-of-spec LEDs. FIG. 35 shows a section view of RGB LED pixels 3015, 3025, and 3035 after the replacement process.

It is to be understood that the exemplary embodiments described herein are that for presently preferred embodiments and thus should be considered in a descriptive sense only and not for purposes of limitation. Descriptions of features or aspects within each embodiment should typically be considered as available for other similar features or aspects in other embodiments.

What is claimed is:

1. A micro-light emitting diode (LED) display comprising:
    a first substrate;
    a red LED pixel, a green LED pixel, and a blue LED pixel disposed on the first substrate and having a pitch smaller than a predetermined size;
    a second substrate having disposed thereon a first electrode, a second electrode, and a third electrode configured to be electrically coupled to the red LED pixel, the green LED pixel, and the blue LED pixel, respectively; and
    an anisotropic conductive film (ACF) layer filling a gap between the first substrate and the second substrate and simultaneously contacting the first substrate and the second substrate, wherein the ACF layer comprises conductive particles.

2. The method of claim 1, wherein each of the array of RGB LED units comprises the red LED pixel, the green LED pixel, and the blue LED pixel arranged in a row.

3. The micro-LED display of claim 1, wherein the pitch is smaller than 100 μm.

4. The micro-LED display of claim 1, wherein the conductive particles are nano-sized metal particle.

5. The micro-LED display of claim 1, wherein the first substrate is cover glass or touch sensitive panel.

* * * * *